US008680472B2

(12) United States Patent
Mochizuki et al.

(10) Patent No.: US 8,680,472 B2
(45) Date of Patent: Mar. 25, 2014

(54) RADIATION DETECTING APPARATUS AND RADIATION IMAGING SYSTEM

(75) Inventors: Chiori Mochizuki, Sagamihara (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 824 days.

(21) Appl. No.: 12/596,493

(22) PCT Filed: Jul. 18, 2008

(86) PCT No.: PCT/JP2008/063465
§ 371 (c)(1),
(2), (4) Date: Mar. 10, 2010

(87) PCT Pub. No.: WO2009/011465
PCT Pub. Date: Jan. 22, 2009

(65) Prior Publication Data
US 2010/0294942 A1 Nov. 25, 2010

(30) Foreign Application Priority Data

Jul. 19, 2007 (JP) ................................. 2007-188206
Jul. 1, 2008 (JP) ................................. 2008-172621

(51) Int. Cl.
*H01L 27/146* (2006.01)
*G01T 1/20* (2006.01)

(52) U.S. Cl.
USPC ................................. 250/370.09; 250/370.11

(58) Field of Classification Search
USPC ........................................ 250/370.09, 370.11
See application file for complete search history.

(56) References Cited

U.S. PATENT DOCUMENTS 6,075,256 A    6/2000   Kaifu et al. ..................... 257/53
6,696,687 B1   2/2004   Tomisaki et al. ........ 250/370.09
(Continued)

FOREIGN PATENT DOCUMENTS

CN   1517069 A   8/2004
EP   1330117     7/2003
(Continued)

OTHER PUBLICATIONS

Office Action dated May 17, 2011, issued in P.R.C. counterpart application 200880020617.2 (with translation).
(Continued)

*Primary Examiner* — David Porta
*Assistant Examiner* — Mindy Vu
(74) *Attorney, Agent, or Firm* — Fitzpatrick, Cella, Harper & Scinto

(57) ABSTRACT

A radiation detecting apparatus capable of obtaining good images including decreased noise includes a plurality of pixels, each having a photoelectric conversion element for converting incident radiation into an electric signal and a first switch element, connected to the photoelectric conversion element, and a second switch element, not connected to the conversion element. A first signal line, a second signal line and a drive line are provided, where the first switch element has a first main electrode connected electrically to the first signal line, a second main electrode connected electrically to the photoelectric conversion element, and a gate electrode connected electrically to the drive line, and the second switch element has a first main electrode connected to the second signal line and a gate electrode connected electrically to the drive wiring common to the first switch element, and a differential means for outputting a signal corresponding to a difference between outputs from the first and second switch elements.

6 Claims, 23 Drawing Sheets

(56) References Cited

U.S. PATENT DOCUMENTS

| | | | |
|---|---|---|---|
| 7,078,701 B2 * | 7/2006 | Ishii et al. | 250/370.08 |
| 7,205,568 B2 | 4/2007 | Watanabe et al. | 257/59 |
| 7,435,968 B2 | 10/2008 | Watanabe et al. | 250/370.14 |
| 7,535,506 B2 | 5/2009 | Nomura et al. | 348/308 |
| 7,541,617 B2 | 6/2009 | Mochizuki et al. | 257/72 |
| 7,557,355 B2 | 7/2009 | Mochizuki et al. | 250/370.99 |
| 7,629,564 B2 | 12/2009 | Mochizuki et al. | 250/208.1 |
| 7,645,976 B2 | 1/2010 | Watanabe et al. | 250/208.2 |
| 2003/0117510 A1 | 6/2003 | Sakurai et al. | 348/308 |
| 2003/0226974 A1 | 12/2003 | Nomura et al. | 250/370.11 |
| 2006/0065845 A1 | 3/2006 | Yamaguchi | 250/370.09 |
| 2006/0065944 A1 | 3/2006 | Mochizuki et al. | 257/444 |
| 2007/0279661 A1 * | 12/2007 | Misawa | 358/1.9 |
| 2009/0052624 A1 | 2/2009 | Mochizuki et al. | 378/98.8 |
| 2010/0001194 A1 | 1/2010 | Ishii et al. | 250/370.08 |

FOREIGN PATENT DOCUMENTS

| | | |
|---|---|---|
| JP | 58-080865 | 5/1983 |
| JP | 2003-198949 | 7/2003 |
| JP | 2006-0128644 | 5/2006 |
| WO | WO 91/03745 | 3/1991 |

OTHER PUBLICATIONS

Office Action issued Apr. 22, 2013 in counterpart Japanese Patent Application No. 2008-172621, with translation.

JPO Office Action issued on Jul. 8, 2013 in counterpart Japanese Patent Application No. 2008-172621 (partial translation provided above).

* cited by examiner

RADIATION DETECTING APPARATUS AND RADIATION IMAGING SYSTEM

TECHNICAL FIELD

The present invention relates to a radiation detecting apparatus and a radiation imaging system. Incidentally, the present specification supposes that not only electromagnetic waves, such as visible light, but also X-rays, particulate beams such as α-rays and β-rays, and γ-rays, and the like, are included in the scope of the term "radiation". And the term "conversion element" includes a photoelectric conversion element converting light such as visible light into an electric signal.

BACKGROUND ART

Conventionally, radiography used for medical diagnostic imaging is classified into plain radiography for obtaining a still image, such as X-ray radiographing, and fluoroscopic radiography for obtaining a moving image. For each kind of radiography, there is a corresponding type of radiographing apparatus.

In recent years, a flat-panel detector has been noticed, which includes a sensor panel on which pixels, each including a conversion element to convert radiation or light from a scintillator layer into electric charges and a switch element, are arranged in a matrix on a substrate. The term "flat-panel detector" will be abbreviated to "FPD" in the following.

In particular, a conversion element prepared by using a non-crystalline semiconductor, such as amorphous silicon, and a thin film transistor prepared by using a non-crystalline semiconductor are used as described in WO 91/03745 (Published Japanese Translation of PCT Application No. H07-502865), U.S. Pat. No. 6,075,256 (Japanese Patent Application Laid-Open No. H08-116044), and U.S. Patent Application Publication 2003/0226974 (Japanese Patent Application Laid-Open 2004-015002).

For brevity, non-crystalline semiconductors will be referred to as "a-S1" in the following, and "thin film transistor" will be abbreviated to TFT in the following.

The FPD has begun to be applied to a wide range of radiography from plain radiography to fluoroscopic radiography. Moreover, this kind of apparatus is required to decrease the dosage received by the patient, and the improvement of a signal output by the improvement of an aperture ratio and the decrease of noise are generally always required. In particular, the decrease of line noise brings about a large effect of improving the sensitivity of the FPD.

Methods of removing line noise generation factors (extrinsic factors and intrinsic factors) and methods of compensating have been considered, and various methods have been proposed as ways to compensate for noise. For example, U.S. Patent Application Publication 2006/0065845 (Japanese Patent Application Laid-Open No. 2006-101394) proposed the method of subtracting noise caused by parasitic capacitance generated at the crossing portions of signal lines and gate lines from signal outputs by arranging noise compensation lines in parallel with the signal lines. In that document, noise was considered as offset components.

Moreover, the image data of this kind of radiation detecting apparatus is obtained by taking in a dark output before radiation irradiation and a photo output after the radiation irradiation, and by deducting the dark output from the photo output.

In other words, it is always needed to deduct the dark output from the photo output in order to obtain one image, and the deduction becomes a large problem for high speed operation, that is, the improvement of operation speed in moving image driving.

At this time, although it is also considered to suppress the reading frequency of the dark output to the minimum, that is, to perform the deduction by using initial dark output data, it can be said that it is desirable to perform the deduction every time, or to perform the deduction at a certain frequency, in view of image quality.

As an example, U.S. Pat. No. 6,696,687 (Japanese Patent Application Laid-Open No. 2001-56382) also proposed to provide a dummy pixel having no photoelectric conversion element at an end of an FPD, and to remove the output of the dummy pixel from an image reading output as an offset output.

DISCLOSURE OF THE INVENTION

However, the cancellation of noise is insufficient by the compensation method of performing compensations only at the wiring crossing portions, which method is disclosed in U.S. Patent Application Publication 2006/0065845 (Japanese Patent Application Laid-Open No. 2006-101394).

Moreover, the accuracy of the cancellation of the noise caused by offset components, the so-called dark outputs, is insufficient by the method disclosed in U.S. Pat. No. 6,696,687 (Japanese Patent Application Laid-Open No. 2001-56382), which method deducts the dark output of the dummy pixel arranged only at the end of the X-ray detection portion from the photo output of the whole X-ray detection portion.

Consequently, further decrease of noise has been sought still, and a method of obtaining a good image has been sought.

Accordingly, the present invention aims to provide a radiation detecting apparatus and a radiation imaging system, both capable of decreasing noise to obtain a good image.

As the means for solving the aforesaid problem, the present invention is a radiation detecting apparatus including: a plurality of pixels, each having a conversion element for converting incident radiation into an electric signal and a first switch element connected to the conversion element; a first signal line; a second signal line and a second switch element not connected to the conversion element; and a drive wiring. The first switch element has a first main electrode connected electrically to the first signal line, a second main electrode connected electrically to the conversion element and a gate electrode connected electrically to the drive wiring, each of the plurality of pixels further has a first main electrode connected electrically to the second signal line and a gate electrode connected electrically to the drive wiring common to the first switch element, and a differential amplifier for outputting a signal corresponding to a difference between outputs from the first and second switch elements.

According to the radiation detecting apparatus and the radiation imaging system of the present invention, noises can be decreased, and consequently a good image can be obtained.

Other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodi

BEST MODE FOR CARRYING OUT THE INVENTION

In the following, exemplary embodiments for implementing the present invention will be described with reference to the attached drawings.

First Embodiment

Figure 1:
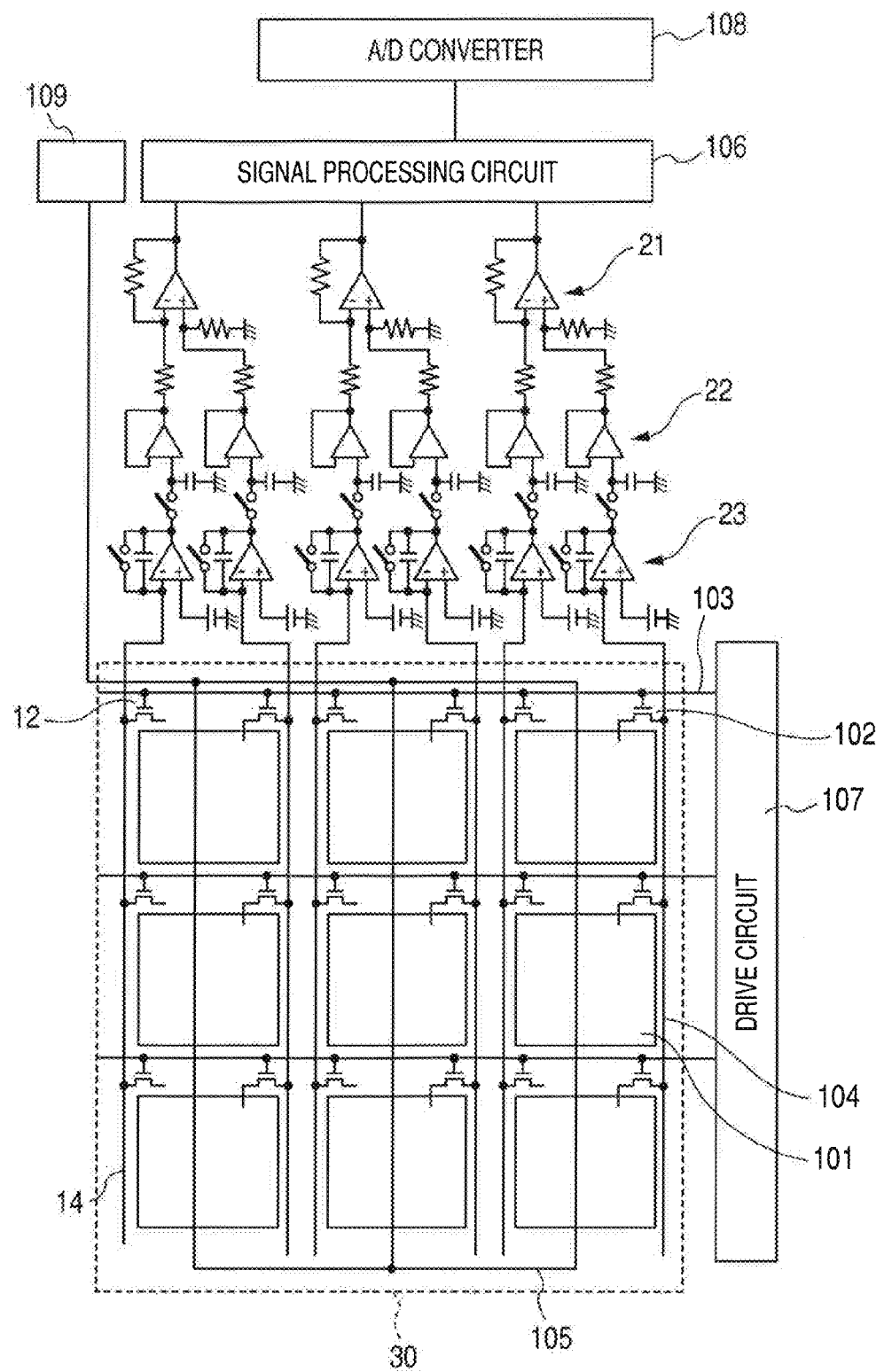
- FIG. 1 is a schematic circuit diagram illustrating the configuration of a radiation detecting apparatus as a first embodiment of the present invention.

FIG. 1 is a schematic circuit diagram illustrating the configuration of a radiation detecting apparatus as a first embodiment of the present invention. In the present invention the radiation may be a visible light. As illustrated in FIG. 1, the radiation detecting apparatus includes PIN type photoelectric conversion elements 101 as conversion elements for converting incident radiation into electric signals, and transfer TFTs 102 as first switch elements. Moreover, the radiation detecting apparatus includes drive lines 103 connected electrically to the gate electrodes of the transfer TFTs 102, and first signal lines 104 connected electrically to the source or drain electrodes as the main electrodes of the transfer TFTs 102. The transfer TFTs 102 include first main electrodes connected electrically to the first signal lines 104, second main electrodes connected electrically to the conversion elements 101, and gate electrodes, operating as control electrodes, connected electrically to the drive wiring. The radiation detecting apparatus further includes a bias line 105 for supplying bias potential, which bias line 105 is electrically connected to the PIN type photoelectric conversion elements 101, as a first bias line. Moreover, the radiation detecting apparatus further includes dummy TFTs 12 as second switch elements. The PIN type photoelectric conversion elements 101, the transfer TFTs 102, the dummy TFTs 12, the first signal lines 104, a second signal lines 14, the drive lines 103 and the bias line 105 are formed on an insulating substrate for forming a radiation detecting substrate 30. The dummy TFTs 12 have almost the same structures as those of the transfer TFTs 102. Having almost the same structures indicates that the transfer TFTs 102 and the dummy TFTs 12 each have almost the same parasitic capacitance. The radiation detecting apparatus further includes dummy signal lines 14 having almost the same structures as those of the first signal lines 104 and connected to the source or drain electrodes of the dummy TFTs 12, which are the main electrodes of the dummy TFTs 12, as second signal lines. The dummy TFTs 12 include first main electrodes connected electrically to the second signal lines, and gate electrodes connected electrically to the drive wiring.

Then, each of the PIN type photoelectric conversion elements 101, the transfer TFTs 102, and the dummy TFTs 12 constitutes a pixel. As illustrated in FIG. 1, a plurality of pixels exists. A plurality of pixels may be arranged two-dimensionally along one and the other directions. According to the present embodiment, as shown in FIG. 1, the pixels are arranged in the matrix. A gate electrode of a transfer TFT 102 and a gate electrode of a dummy TFT 12 of each pixel in a pixel row of the plural pixels arranged in the one direction are connected to a drive electrode rive line 103.

A first main electrode of the transfer TFT 102 of each pixel in a pixel column of the plural pixels arranged in the other direction is electrically connected to a first signal line 104, and a first main electrode of the dummy TFT 12 of each pixel in the pixel column is electrically connected to a dummy signal line 14.

The gate electrodes of one of the transfer TFTs 102 and one of the dummy TFTs 12 that exist in the same pixel are electrically connected to one of the common drive lines 103. The dummy TFTs 12 function as dummy switch elements. The radiation detecting apparatus further includes differential amplifiers 21, operating as a differential unit, outputting signals corresponding to differences between the outputs of the first switch elements and the outputs of the second switch elements, buffer amplifiers 22, and integration amplifiers 23. The radiation detecting apparatus further includes a signal processing circuit 106, an A/D converter 108, and a drive circuit 107 for driving the transfer TFTs 102 and the dummy TFTs 12. The differential unit may be any unit capable of a subtracting operation (that is, that unit need not be a differential amplifier). Herein, the differential amplifier 21, a buffer amplifier 22, and integration amplifier 23 are disposed out side of the radiation detection substrate 30, and are electrically connected to the radiation detection substrate 30. However, the differential amplifier 21, a buffer amplifier 22, and integration amplifier 23 may be arranged as IC chip of an insulating substrate as the radiation detection substrate 30. In this case, the radiation detection substrate 30 is provided with a differential unit.

In the present embodiment, radiation (X-rays, α beams, β beams, or γ-rays) is converted into visible light by scintillator layers (not shown), and the visible light is photoelectrically converted by the PIN type photoelectric conversion elements 101. Consequently, the photoelectric conversion elements 101 functions as sensors.

The charges accumulated in the PIN type photoelectric conversion elements 101 are output through the signal lines 104 by operating the transfer TFTs 102. The outputs are signals including the influences from the outside of the apparatus or the influences in the apparatus (such as noise components infiltrating from the power source of the apparatus) at the time of the operation of the transfer TFTs 102. Then, each of the magnitudes of the noise components sometimes changes with time.

The charges output through the dummy signal lines 14 by operating the dummy TFTs 12 become signals of the noise components generated by the influences from the outside of the apparatus or the influences in the apparatus at the time of the operation, and to operate the transfer TFT and the radiation detection substrate 30 is to turn on each of the TFT's. That is, when the first and second switches are at on state, an electric signal is supplied to the first signal line of the pixel column, and noise is supplied to the second signal line of pixel column.

Then, the dummy TFTs 12 connected to each of the drive lines 103 shared with the transfer TFTs 102 operate simultaneously with the transfer TFTs 102. Consequently, pertinent signals can be obtained by deducting noise components arising on the dummy signal lines 14 and the dummy TFTs 12 besides in the wire crossing portions from the outputs obtained by the transfer TFTs 102 in the same pixels.

Consequently, the decreases of line noise, which is the noise relevant to the timing of the drive potential of the TFTs 102 given to the drive lines 103, can be suitably performed in all the pixels.

Moreover, the parasitic capacitance (about a half of the whole) at the crossing portions with the drive lines 103 and the parasitic capacitance (about a half of the whole) at the TFT portions are generated on the signal lines 104. Accordingly, the line noise can be effectively decreased by making the parasitic capacitance almost the same also on the dummy signal lines 14.

Figure 2:
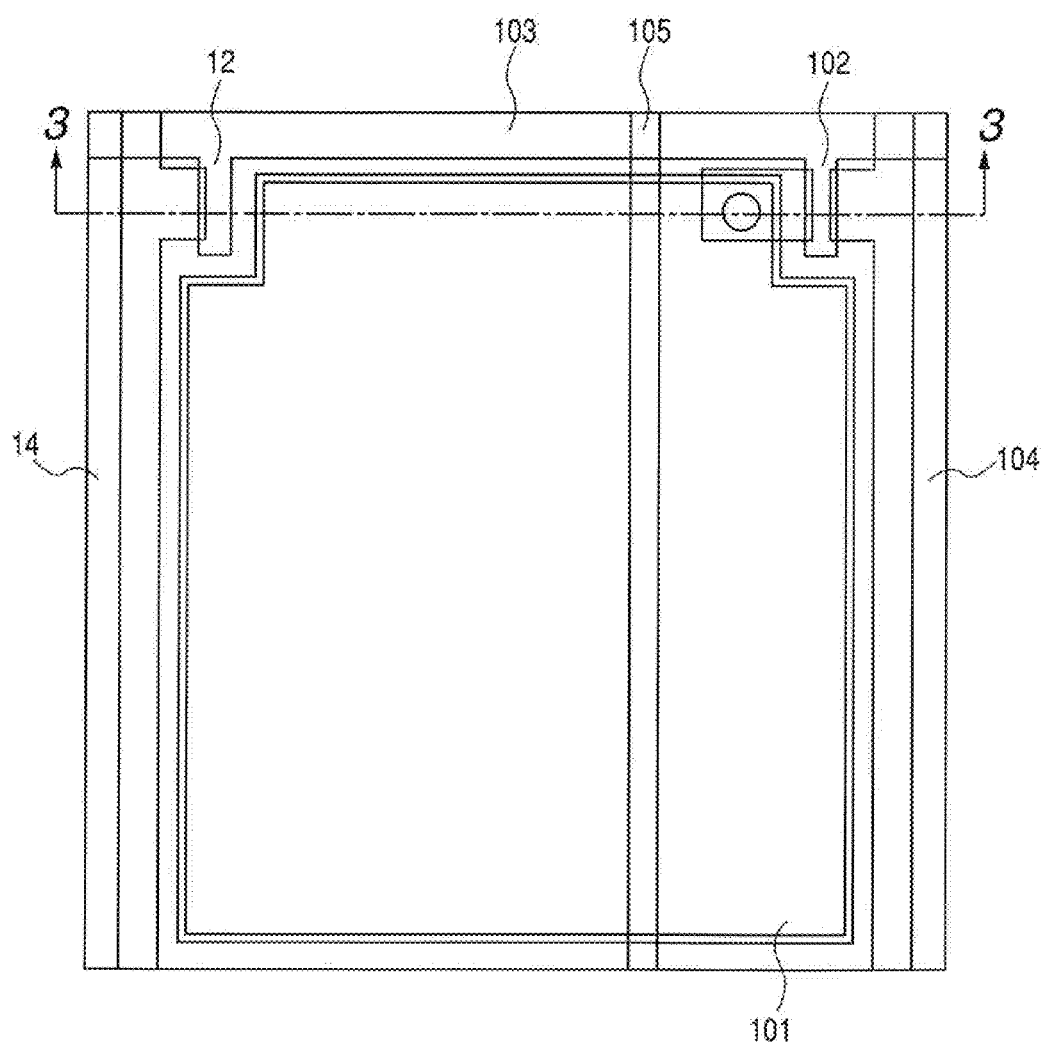
FIG. 2 is a schematic plan view of one pixel of the radiation detecting apparatus of the first embodiment of the present invention.

FIG. 2 is a schematic plan view of a pixel of the radiation detecting apparatus of the present embodiment. In FIG. 2, reference numerals are the same as those in FIG. 1.

Figure 3:
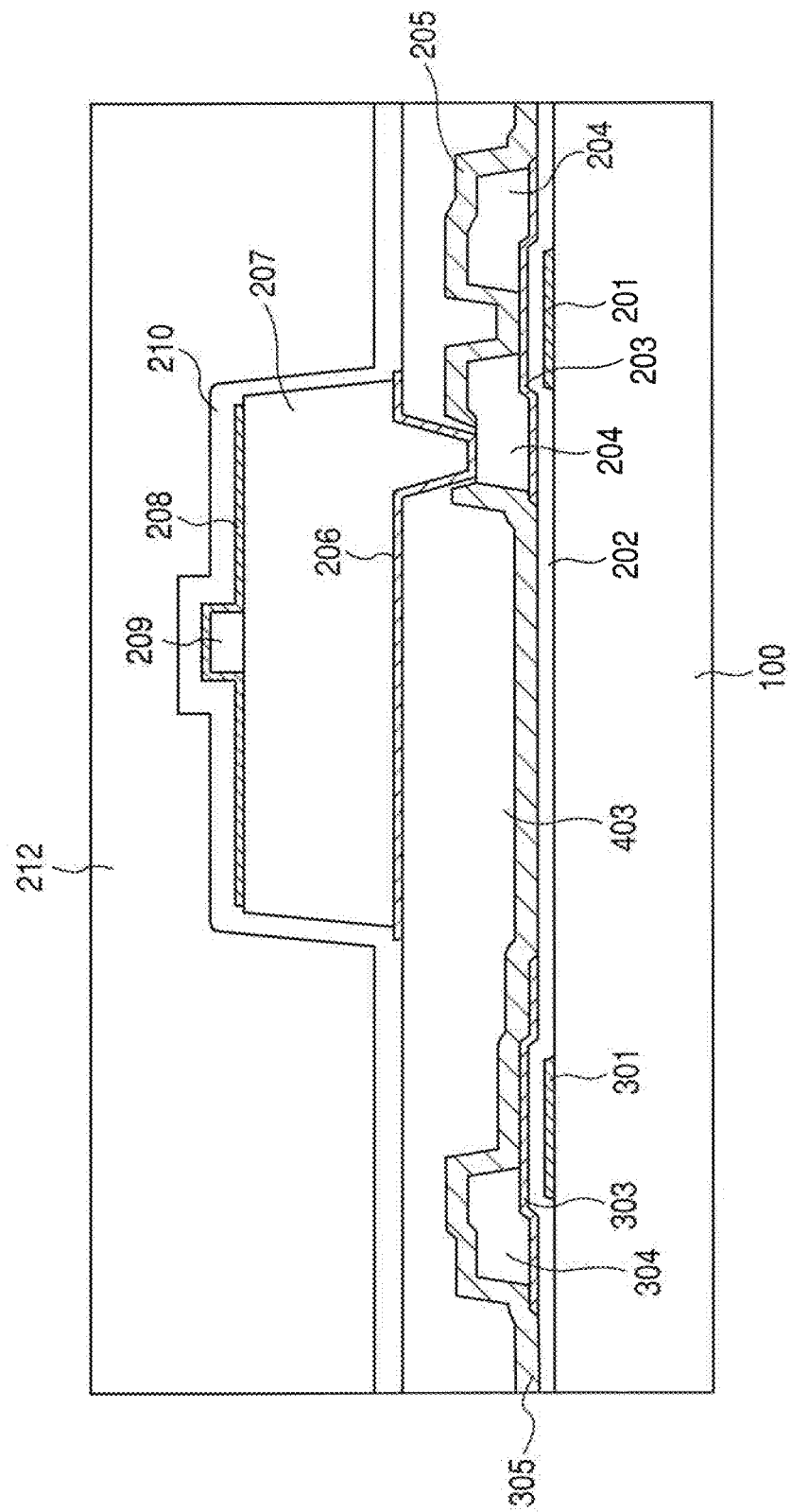
FIG. 3 is a schematic sectional view taken along a line 3-3 in FIG. 2.

FIG. 3 is a schematic sectional view at a line 3-3 in FIG. 2.

As illustrated in FIG. 3, an insulating substrate 100 such as a glass substrate, the transfer TFT 102 includes a gate electrode 201, a gate insulating film 202, a semiconductor layer 203, source and drain electrodes 204 as the respective main electrodes, and a protective film 205.

Moreover, the photoelectric conversion element 101 includes a lower electrode 206, a semiconductor layer 207, an upper electrode 208, which is a transparent conductive film, a bias line 209, and a protection layer 210.

On the other hand, the dummy TFT 12 includes a gate electrode 301, a semiconductor layer 303, a source or drain electrode 304 as the main electrode, and a protective film 305 (the protective film 205 and the protective film 305 are made of the same protective film). The pixel further includes an interlayer insulation layer 403 and a protection layer 212 arranged on the photoelectric conversion element 101 (the last protection layer).

The main electrode of the dummy TFT 12 in the present embodiment only includes either the source or drain electrode 304 connected electrically to the dummy signal line 14.

At this time, in the transfer TFT 102, an ohmic layer is situated between the source and drain electrodes 204 and the semiconductor layer 203, and is removed in a channel portion. On the other hand, in the dummy TFT 12, the structure in which an ohmic layer exists under the source or drain electrode 304 and the ohmic layer is removed in the other regions including a channel portion is adopted. This is the structure for making the parasitic capacitance on the dummy signal line 14 be almost the same.

The signal lines 104 and the dummy signal lines 14, and the transfer TFTs 102 and the dummy TFTs 12 are made by the same process, respectively, so that they have the same layer configurations and the same sizes, respectively. Incidentally, as described above, the dummy TFTs 12 have no electrode parts corresponding to the main electrodes opposed to the source or drain electrodes 304 connected electrically to the dummy signal lines 14 of the dummy TFTs 12.

In the present embodiment, the positional relationships between the signal lines 104 and the transfer TFTs 102 and the positional relationships between the dummy signal lines 14 and the dummy TFTs 12 are in the same relationships in the right-left directions. In other words, the configuration is the one in which the positions of the dummy signal lines 14 and the dummy TFTs 12 are arranged with offsets to the signal lines 104 and the transfer TFTs 102 along the drive lines 103 as references. This configuration aims that the influences caused by extrinsic factors are similarly exerted on both the signal lines 104 and the dummy signal lines 14. Consequently, signals having effectively decreased noise components can be obtained.

Figure 4:
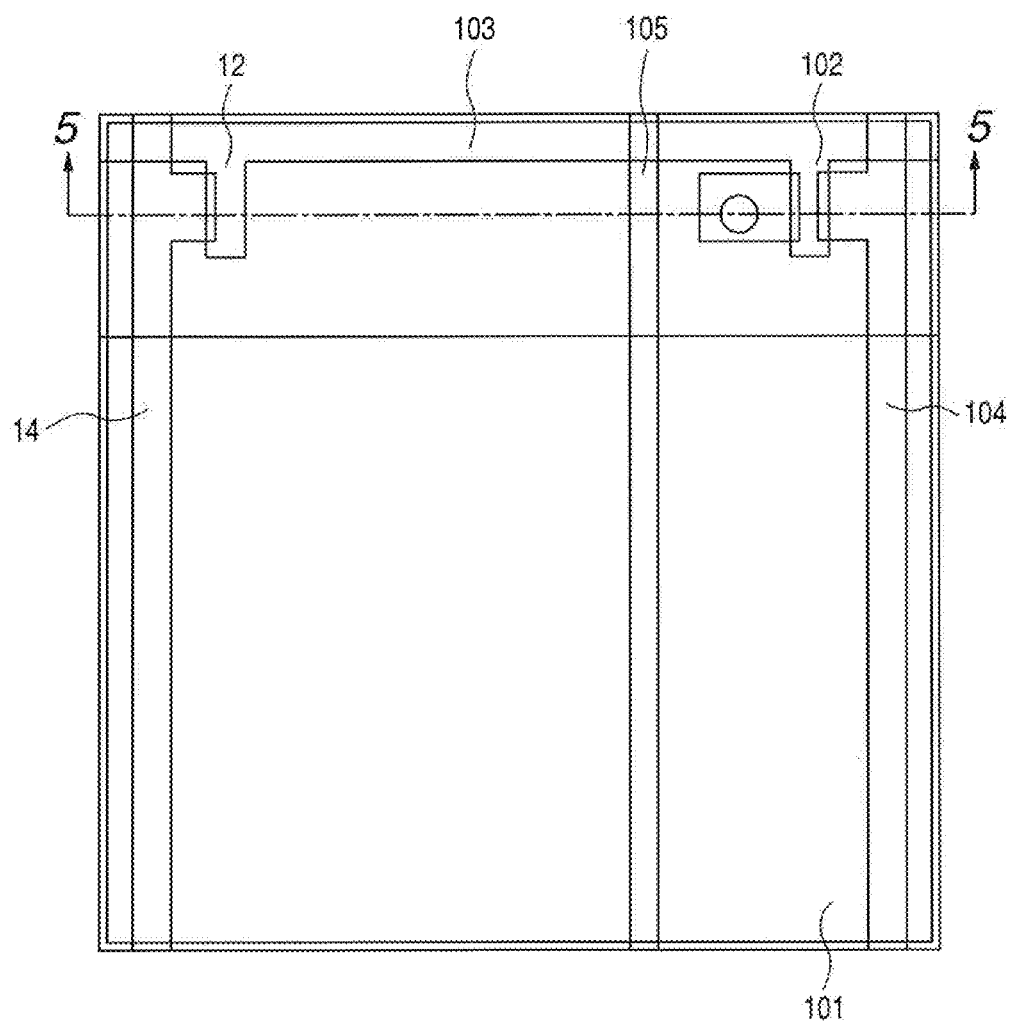
FIG. 4 is a schematic plan view of one pixel of an application example of the radiation detecting apparatus of the first embodiment of the present invention.

FIG. 4 illustrates an application example of the present embodiment, and the example differs from the structure illustrated in FIG. 2 in that the photoelectric conversion element 101 is laminated to be arranged to cover the transfer TFT 102 and the dummy TFT 12.

Figure 5:
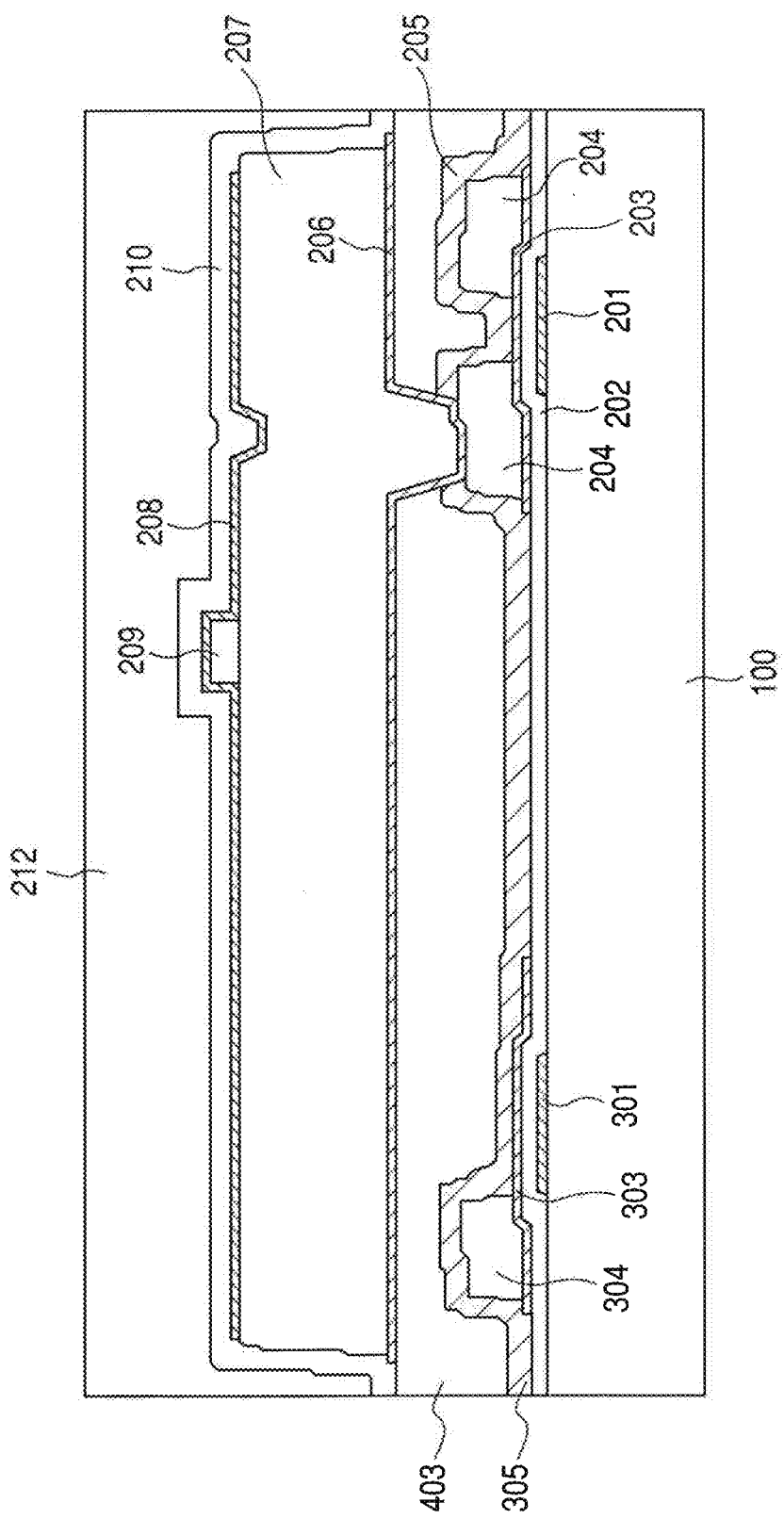
FIG. 5 is a schematic sectional view taken along a line 5-5 of FIG. 4.

FIG. 5 is a schematic sectional view taken along a line 4-4 in FIG. 4. The distance between the lower electrode 206 of the photoelectric conversion element 101 and the main electrodes 203 of the transfer TFT 102 connected electrically to the signal wiring 104, and the distance between the lower electrode 206 and the main electrode 204 connected to the dummy signal wiring 14 electrically are substantially the same. Consequently, the parasitic capacitance generated between the lower electrode 206 of the photoelectric conversion element 101 and the main electrodes 204 of the transfer TFT 102 and the parasitic capacitance generated between the lower electrode 206 and the main electrode 304 of the dummy TFT 12 are substantially the same. Consequently, line noise can effectively be decreased.

On the signal lines 104, parasitic capacitance is generated at the portions crossing with the drive lines 103 (about a third part of the whole), TFT portions (about a third part of the whole), and the portions overlapping with the photoelectric conversion elements 101 (about a third part of the whole). Accordingly, by making the parasitic capacitance almost the same also on the dummy signal lines 14, line noise can effectively be decreased.

Moreover, the configuration illustrated in FIGS. 4 and 5 is suitable because the aperture ratios of the photoelectric conversion elements 101 can be improved even in the configuration including the dummy TFTs 12.

Figure 6:
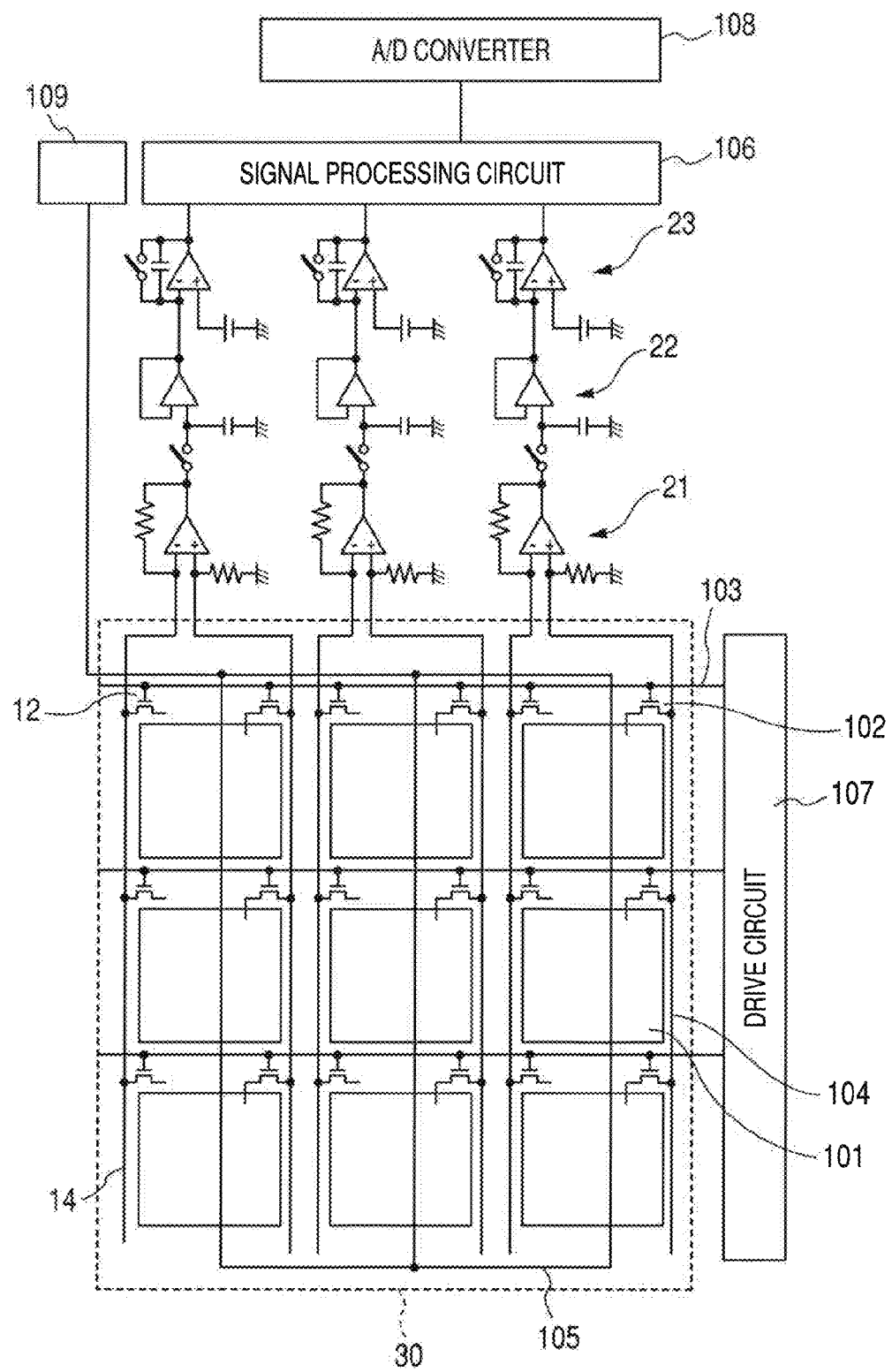
FIG. 6 is a schematic circuit diagram of an application example of the radiation detecting apparatus of the first embodiment of the present invention.

FIG. 6 is a schematic circuit diagram illustrating the configuration as an application example of the radiation detecting apparatus illustrated in FIG. 1.

The configuration of processing signals from pixels in the differential amplifiers 21 and the buffer amplifiers 22 in that order is illustrated in place of processing the signals in the integration amplifiers 23, the buffer amplifiers 22, and the differential amplifiers 21 in that order.

By the foregoing configuration, the signals from the transfer TFTs 102 and the dummy TFTs 12 can be input into the differential amplifiers 21 without passing through the integration amplifiers 23 and the buffer amplifiers 22, and consequently the accuracy of noise removal is improved.

Second Embodiment

Figure 7:
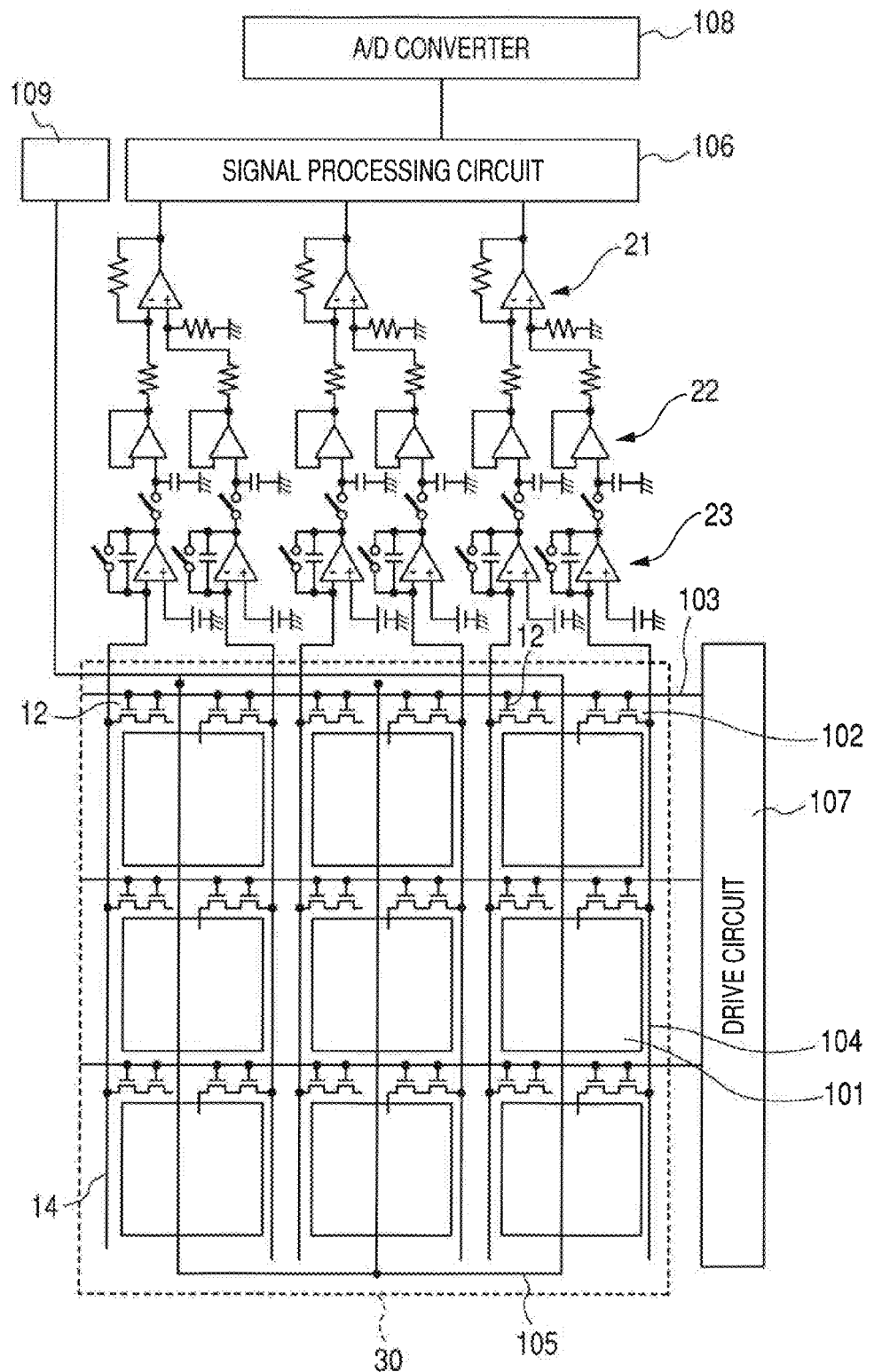
FIG. 7 is a schematic circuit diagram illustrating the configuration of a radiation detecting apparatus as a second embodiment of the preset invention.

FIG. 7 is a schematic circuit diagram illustrating the configuration of a radiation detecting apparatus as a second embodiment of the present invention. The present embodiment adopts a double gate structure in which each of the transfer TFTs 102 and the dummy TFTs 12 includes serially connected two TFTs, the gate electrodes of which are connected to one of the common drive lines 103. Then, as described below, the transfer TFTs 102 and the dummy TFTs 12 are polysilicon TFTs. By configuring the transfer TFTs 102 and the dummy TFTs 12 to have the double gate structures, the leak current of each of the TFTs 102 and 12 can be decreased, and consequently noise can be decreased to enable the obtainment of a good image.

Figure 8:
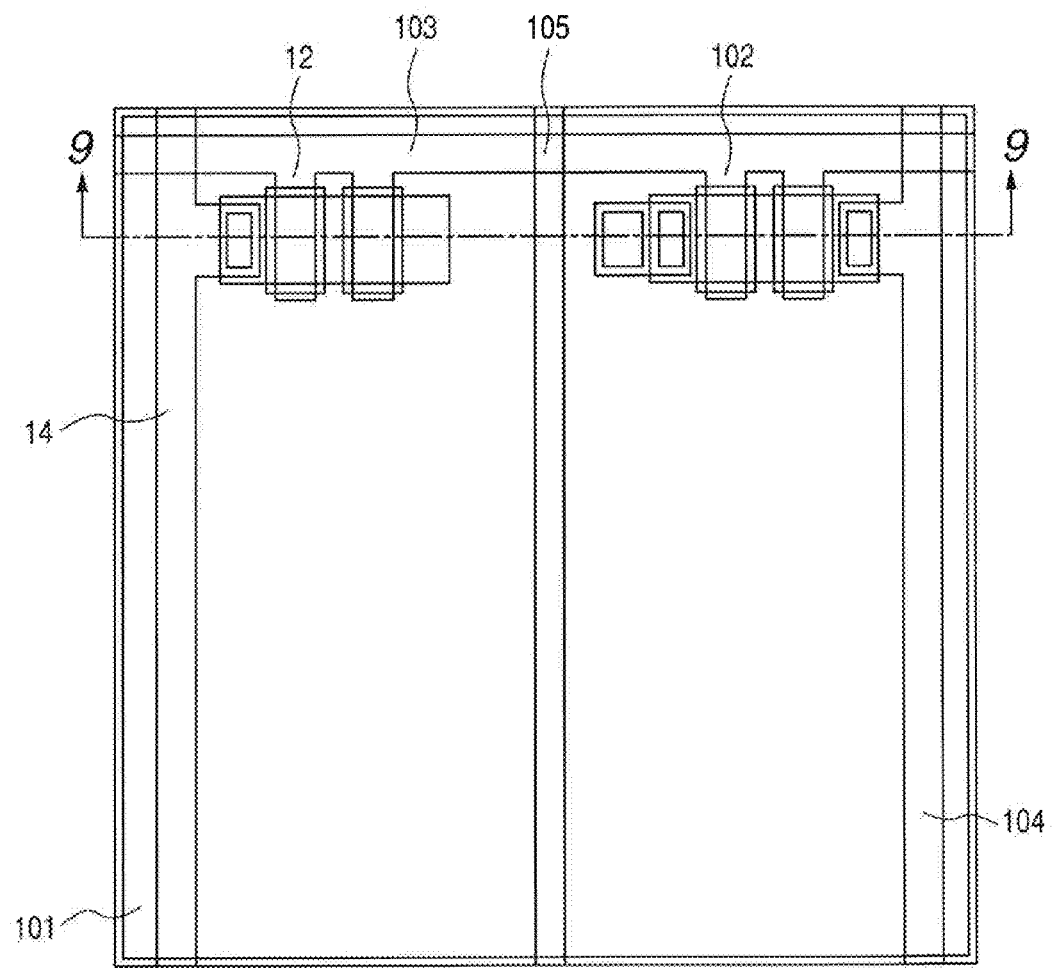
FIG. 8 is a schematic plan view of one pixel of the radiation detecting apparatus of the second embodiment of the present invention.
Figure 9:
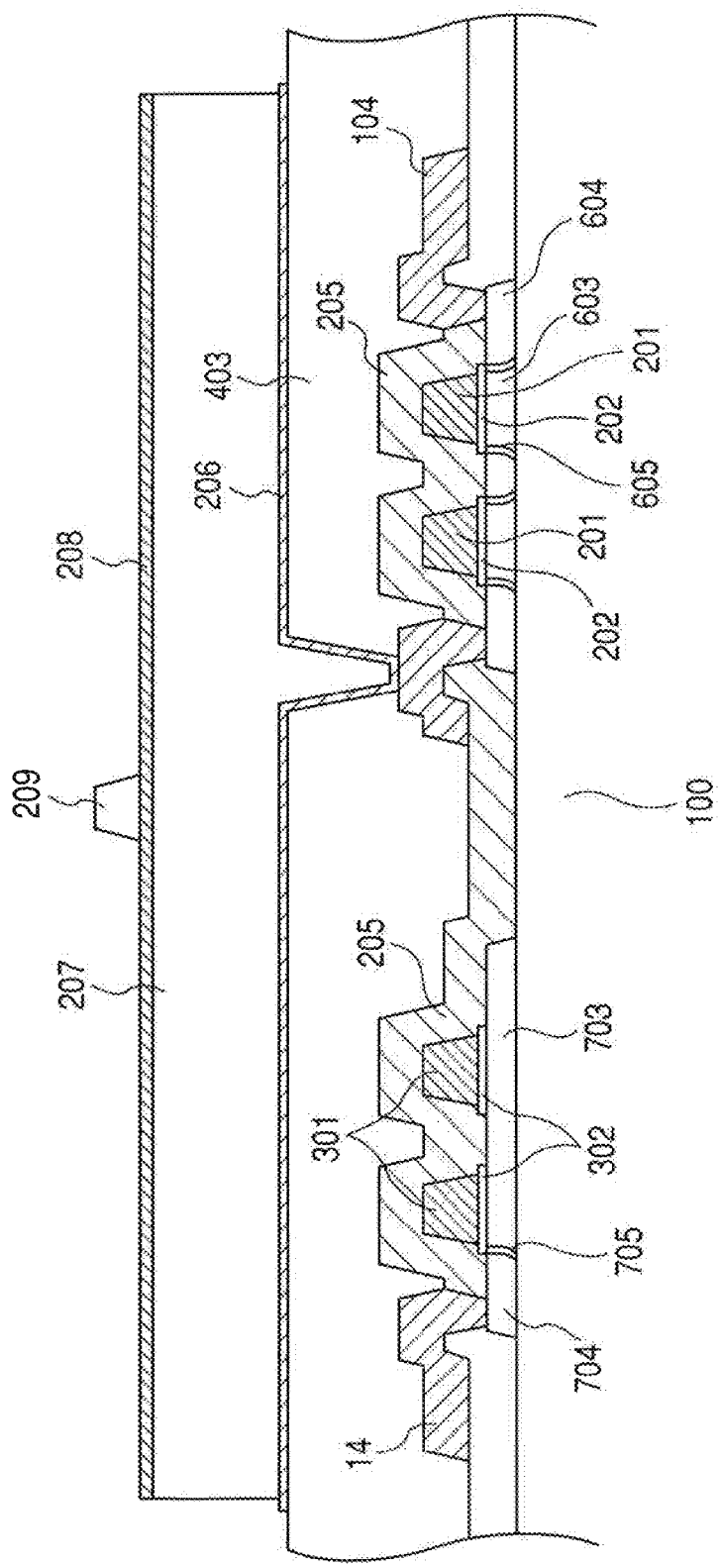
FIG. 9 is a schematic sectional view taken along a line 9-9 in FIG. 8.

FIG. 8 is a schematic plan view of one pixel of a radiation detecting apparatus of the present embodiment. In FIG. 8, the reference numerals are same as those of FIG. 7. FIG. 9 is a schematic sectional view taken along line 9-9 in FIG. 8.

As illustrated in FIG. 9, an insulating substrate 100 such as a glass substrate, the transfer TFTs 102 include the gate electrodes 201, the gate insulating films 202, polysilicon semiconductor layers 603, 604, and 605, and the protective film 205. Here, the semiconductor layers 604 are source and drain electrodes as the main electrodes of the transfer TFTs 102, and are semiconductor regions in which impurity elements are doped. The semiconductor layers 605 are the semiconductor regions doped to be lower than the semiconductor layers 604. The semiconductor layers 603 are non-doped semiconductor regions or the semiconductor regions doped to be extremely low.

On the other hand, the dummy TFTs 12 include the gate electrodes 301, semiconductor layers 703, 704, and 705, and the protective film 305 (the protective film 205 and the protective film 305 are formed of the same protective film). The pixel further includes the interlayer insulation layer 403 and the protection layer 212 arranged on the photoelectric conversion element 101 (the last protection layer).

By the foregoing configuration, the parasitic capacitance connected to the dummy signal lines 14 can be made to be almost the same as that connected to the signal lines 104. Moreover, although the two gate electrodes 301 of the dummy TFTs 12 are provided in the configuration illustrated in FIG. 9, a configuration in which only a TFT connected to one of the dummy signal lines 14 includes a gate electrode in each of the two TFTs constituting the double gate structures may be adopted.

Third Embodiment

Figure 10:
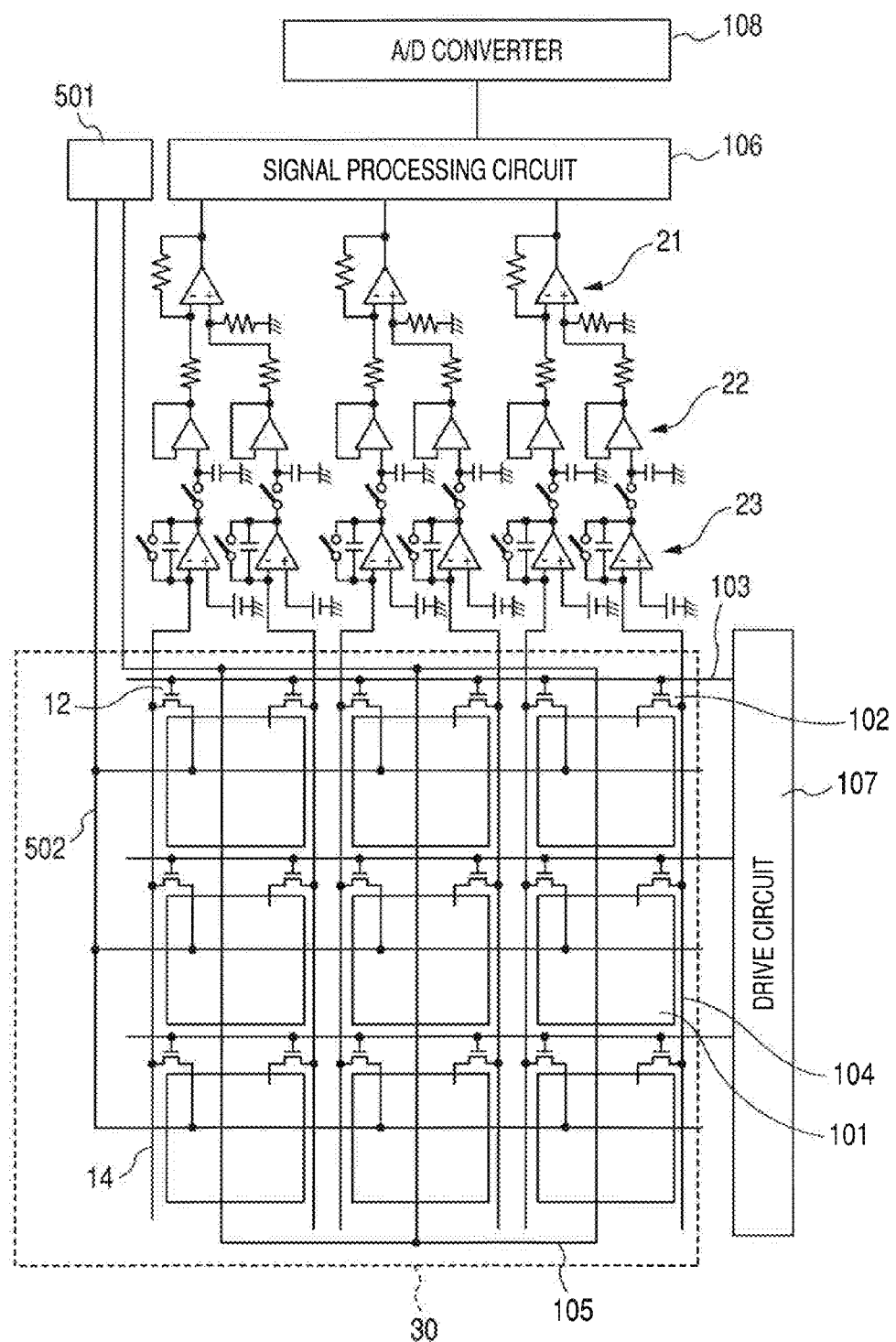
FIG. 10 is a schematic circuit diagram illustrating the configuration of the radiation detecting apparatus as the second embodiment of the present invention.

FIG. 10 is a schematic circuit diagram illustrating the configuration of a radiation detecting apparatus as a second embodiment of the present invention.

As illustrated in FIG. 10, the radiation detecting apparatus includes a power source 501 capable of supplying bias potential and reference voltage wiring 502 for the dummy TFTs 12. The other components are denoted by the same signs as those in the preceding figures.

Also in the present embodiment, similarly to the first embodiment, the dummy signal lines 14 and the dummy TFTs 12 have the same layer configurations and the same sizes as those of the signal lines 104 and the transfer TFTs 102, respectively.

Figure 11:
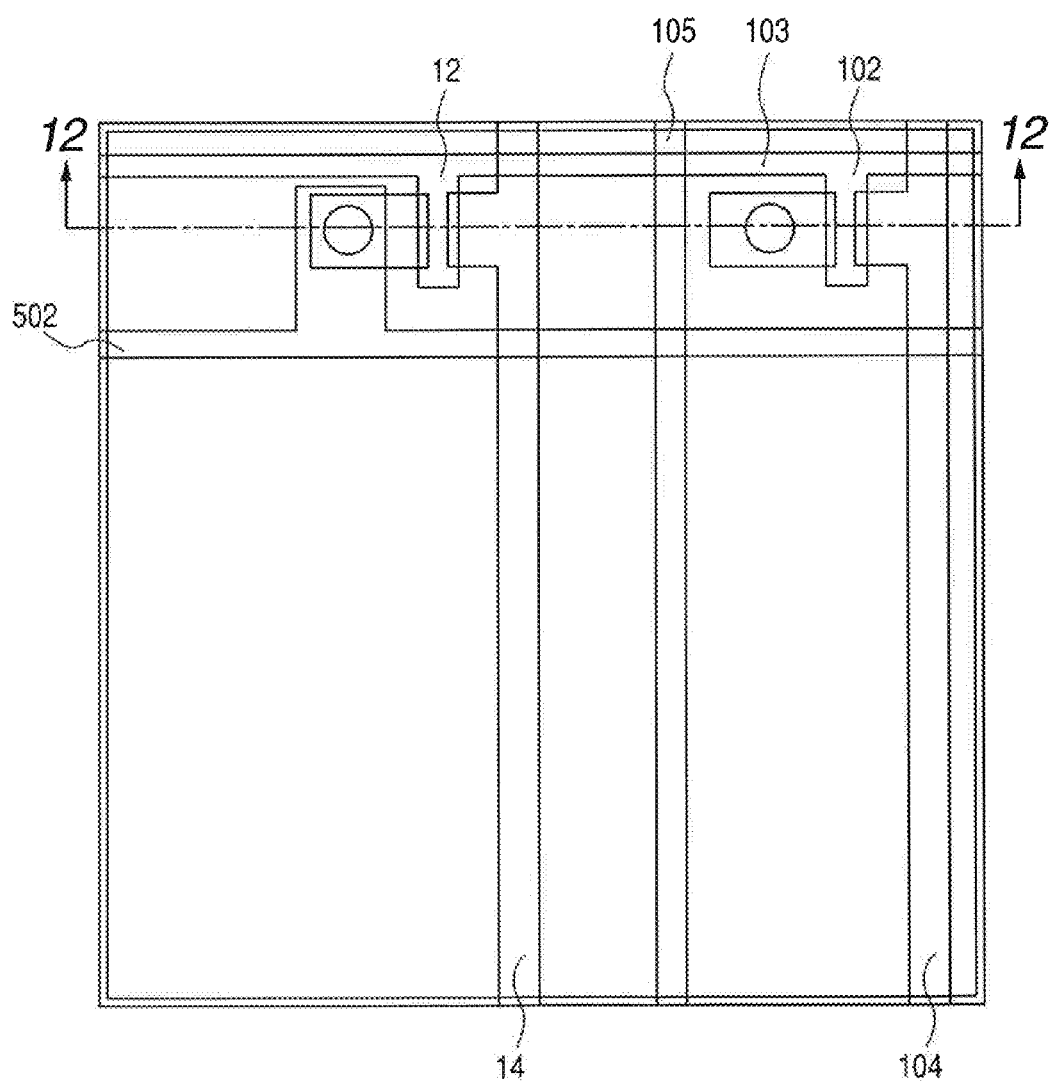
FIG. 11 is a schematic plan view of one pixel of the radiation detecting apparatus of the second embodiment of the present invention.
Figure 12:
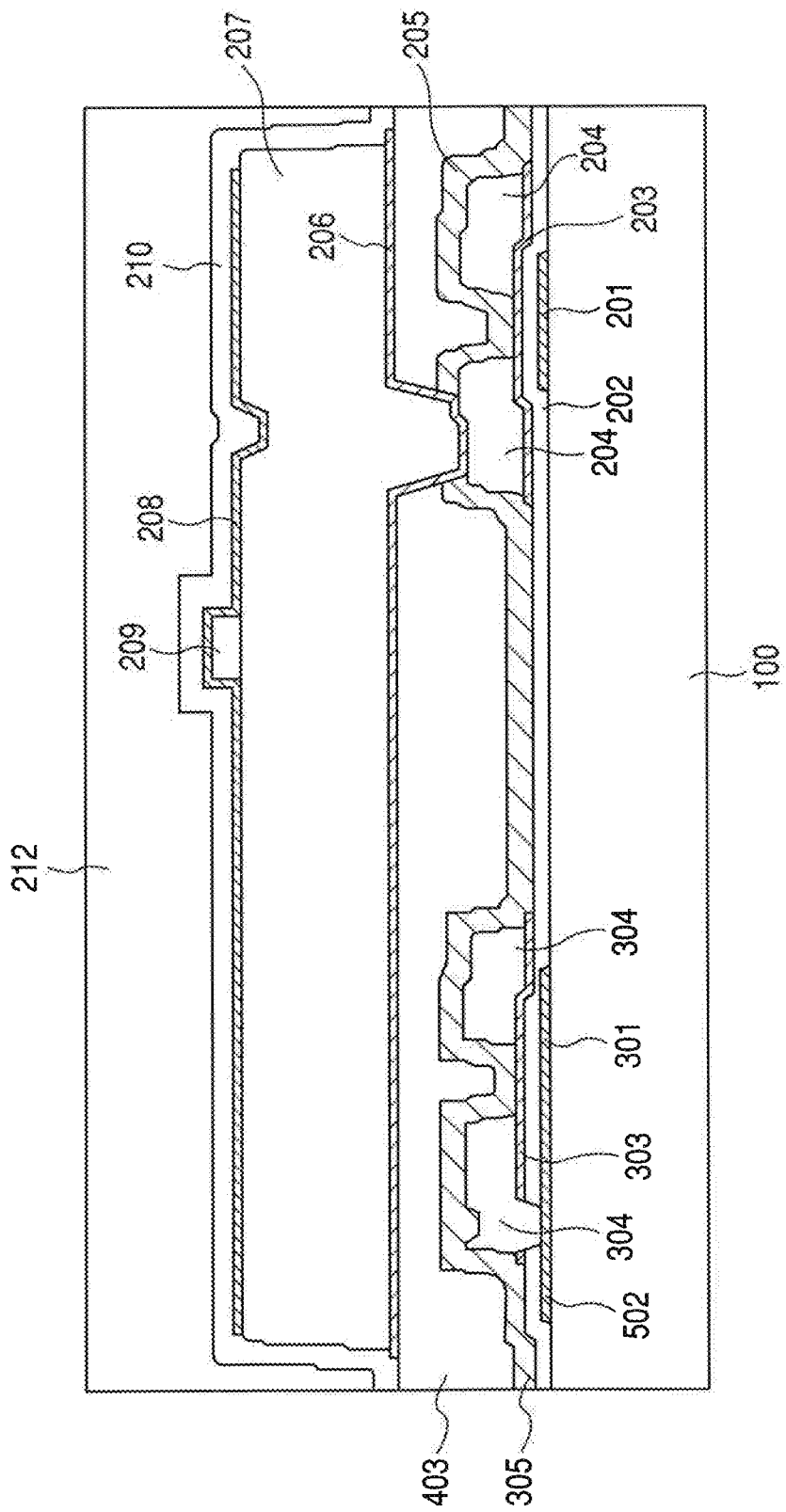
FIG. 12 is a schematic sectional view taken along line 12-12 in FIG. 11.

FIG. 11 is a schematic plan view of a pixel of the radiation detecting apparatus of the present embodiment. In FIG. 11, reference numerals are the same as those in FIG. 10. FIG. 12 is a schematic sectional view taken along line 12-12 in FIG. 11.

A first electrode of the source and drain electrodes 304, which are the main electrodes of the dummy TFT 12, is electrically connected to the dummy signal line 14, and a second electrode of the source and drain electrodes 304 is electrically connected to the reference voltage wiring 502, which is a supplying line of fixed potential. For example, housing ground is used for the fixed potential. Consequently, the dummy TFT 12 is not connected to the photoelectric conversion element 101 similarly to the first embodiment.

The present embodiment adopts a structure for minimizing the influences of the lower electrodes 206 of the photoelectric conversion elements 101 in the configuration in which the interlayer insulation layers 403 are arranged between the photoelectric conversion elements 101 and the TFTs 102. To put it concretely, the present embodiment can be suitably used in the case where the influences of the lower electrodes 206 of the photoelectric conversion elements 101 cannot be neglected such as the case in which the dielectric constants of the interlayer insulation films are high or the case where the formation of thick films is difficult.

In the above embodiment, it is desirable to form the signal lines 104 and the transfer TFTs 102, and the dummy signal lines 14 and the dummy TFTs 12 in almost the same structures, respectively. Moreover, because the directional properties of electric fields and magnetic fields particularly function as extrinsic factors of line noises, it is desirable to arrange the positions of the respective elements in the same directions as illustrated in FIG. 10.

Fourth Embodiment

Figure 13:
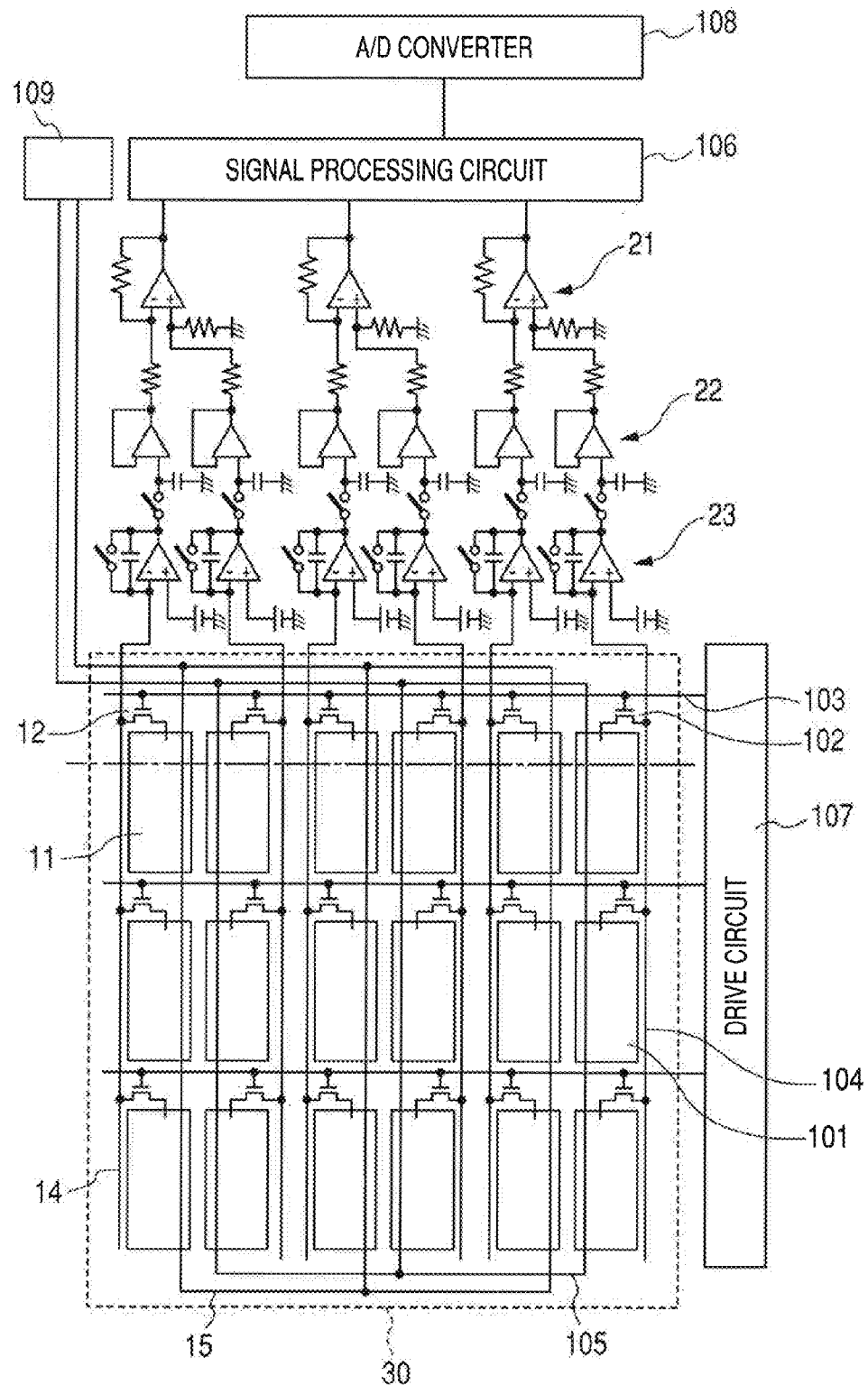
FIG. 13 is a schematic circuit diagram illustrating the configuration of a radiation detecting apparatus as a third embodiment of the preset invention.

FIG. 13 is a schematic circuit diagram illustrating the configuration of a radiation detecting apparatus as a fourth embodiment of the present invention.

As illustrated in FIG. 13, the radiation detecting apparatus includes the PIN type photoelectric conversion elements 101, the transfer TFTs 102, the drive lines 103 of the transfer TFTs 102, the signal lines 104, and the bias line 105 of the PIN type photoelectric conversion elements 101. Moreover, the radiation detecting apparatus includes dummy PIN type photoelectric conversion elements (dummy photoelectric conversion elements) 11, which have almost the same structures as those of the PIN type photoelectric conversion elements 101, as dummy conversion elements, and the dummy TFTs 12, which have almost the same structures as those of the transfer TFTs 102. Moreover, the radiation detecting apparatus further includes the dummy signal lines 14, which have almost the same structures as those of the signal lines 104, and a bias line 15 of the dummy PIN type photoelectric conversion elements 11, as a second bias line. The PIN type photoelectric conversion elements 101, the transfer TFT's 102, a dummy PIN type photoelectric conversion elements 11, the dummy TFT's 12, the first signal lines 104, a second signal lines 14, the drive lines 103 and the bias line 105, 15 are formed on an insulating substrate for forming a radiation detecting substrate 30.

In this case, the gate electrodes of the dummy TFTs 12 are electrically connected to the drive lines 103, and then the transfer TFTs 102 and the dummy TFTs 12 operate simultaneously.

The radiation detecting apparatus further includes the differential amplifiers 21, the buffer amplifiers 22, and the integration amplifiers 23.

Moreover, the dummy photoelectric conversion elements 11 are shielded from light lest any light should enter in order to detect dark outputs. Consequently, the dummy photoelectric conversion elements 11 are formed as simple capacity (capacitor devices). If the bias lines 15 and 105 are made of metal layers capable of shielding incident lights, such as aluminum, the dummy photoelectric conversion elements 11 can be arranged by the use of the same metal layers as the bias lines 15 and 105. Consequently, the manufacturing process of the dummy photoelectric conversion elements 11 can be simplified.

In the radiation detecting apparatus, radiation is converted into visible light by scintillator layers (not shown), and the converted light is photoelectrically converted by the photoelectric conversion elements 101.

The charges accumulated in the photoelectric conversion elements 101 are output through the signal lines 104 by operating the transfer TFTs 102.

The outputs include dark outputs, that is, offset outputs.

Pertinent signals can be obtained by the deductions of the offset outputs including the outputs of the dummy signal line portions, the dummy photoelectric conversion elements 11, and the dummy TFTs 12 that are arranged in the same pixels from the outputs. By arranging each of the photoelectric conversion elements 101 and the dummy photoelectric conversion elements 11, and each of the TFTs 102 and the dummy TFTs 12 in each pixel, pertinent signals can be obtained even if a temperature distribution is generated in pixel regions.

Figure 14:
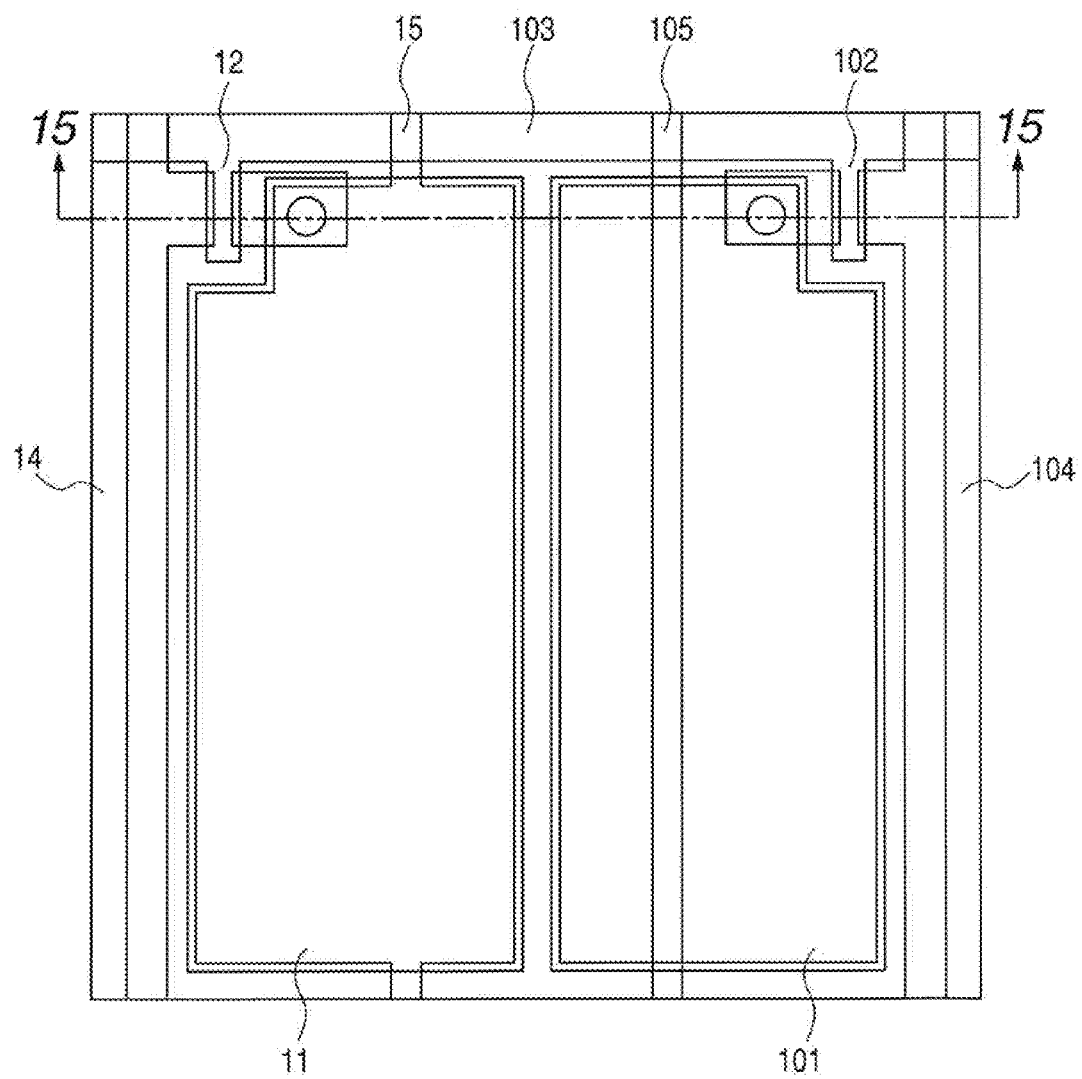
FIG. 14 is a schematic plan view of one pixel of the radiation detecting apparatus of the third embodiment of the present invention.

FIG. 14 is a schematic plan view of a pixel of the radiation detecting apparatus of the present embodiment. In FIG. 14, the reference numerals are the same as those in FIG. 13.

Figure 15:
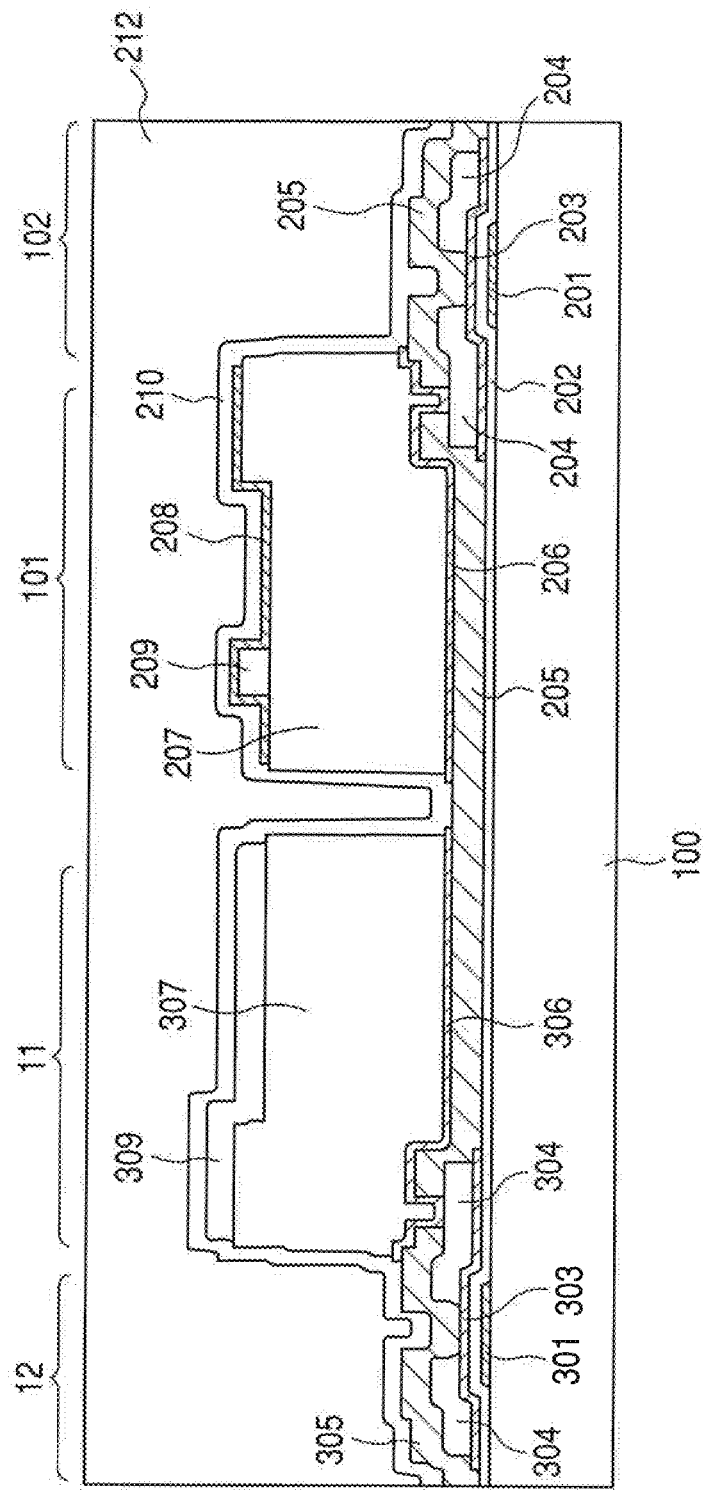
FIG. 15 is a schematic sectional view taken along line 15-15 of FIG. 1.

FIG. 15 is a schematic sectional view taken along line 15-15 in FIG. 14.

As illustrated in FIG. 15, the transfer TFT 102 includes the gate electrode 201, the gate insulating film 202, the semiconductor layer 203, the source and drain electrodes 204, and the protective film 205.

Moreover, the photoelectric conversion element 101 includes the lower electrode 206, the semiconductor layer 207, the transparent upper electrode 208, the bias line 209, and the protection layer 210.

On the other hand, the dummy TFT 12 includes the gate electrode 301, the semiconductor layer 303, the source and drain electrodes 304, and the protective film 305.

Moreover, the dummy photoelectric conversion element 11 includes a lower electrode 306, a semiconductor layer 307, and a bias line 309 as the second bias line, which bias line 309 shares the function of the upper electrode of the dummy photoelectric conversion element 11.

The transfer TFTs 102 and the dummy TFTs 12, and the photoelectric conversion elements 101 and the dummy photoelectric conversion elements 11 have the same layer configurations, respectively, and are formed in the same processes, respectively. In other words, each of the TFTs 102 and 12 and each of the photoelectric conversion elements 101 and 11 have almost the same capacity, respectively.

In the present embodiment, the dummy signal lines 14, the dummy TFTs 12, and the dummy photoelectric conversion elements 11, and the signal lines 104, the transfer TFTs 102, and the photoelectric conversion elements 101 have the same layer configurations and the same sizes, respectively, but it is also possible to miniaturize the dummy photoelectric conversion elements 11 and/or the dummy TFTs 12. In this case, the miniaturization is enabled by multiplying the outputs from the dummy signal lines 14 by a coefficient to perform deductions. The coefficient is obtained from the ratio of the capacity C2 of the dummy photoelectric conversion element (dummy TFT) 11 to the capacity C1 of the photoelectric conversion element (TFT) 101:

$$C1/C2 = (\in 0 \times \in S1 \times S1/L1)/(\in 0 \times \in S2 \times S2/L2)$$

where $\in 0$ is the dielectric constant of the vacuum, $\in S$ is the dielectric constant of an insulating material, S is an electrode area, and L is an interelectrode distance.

Figure 16:
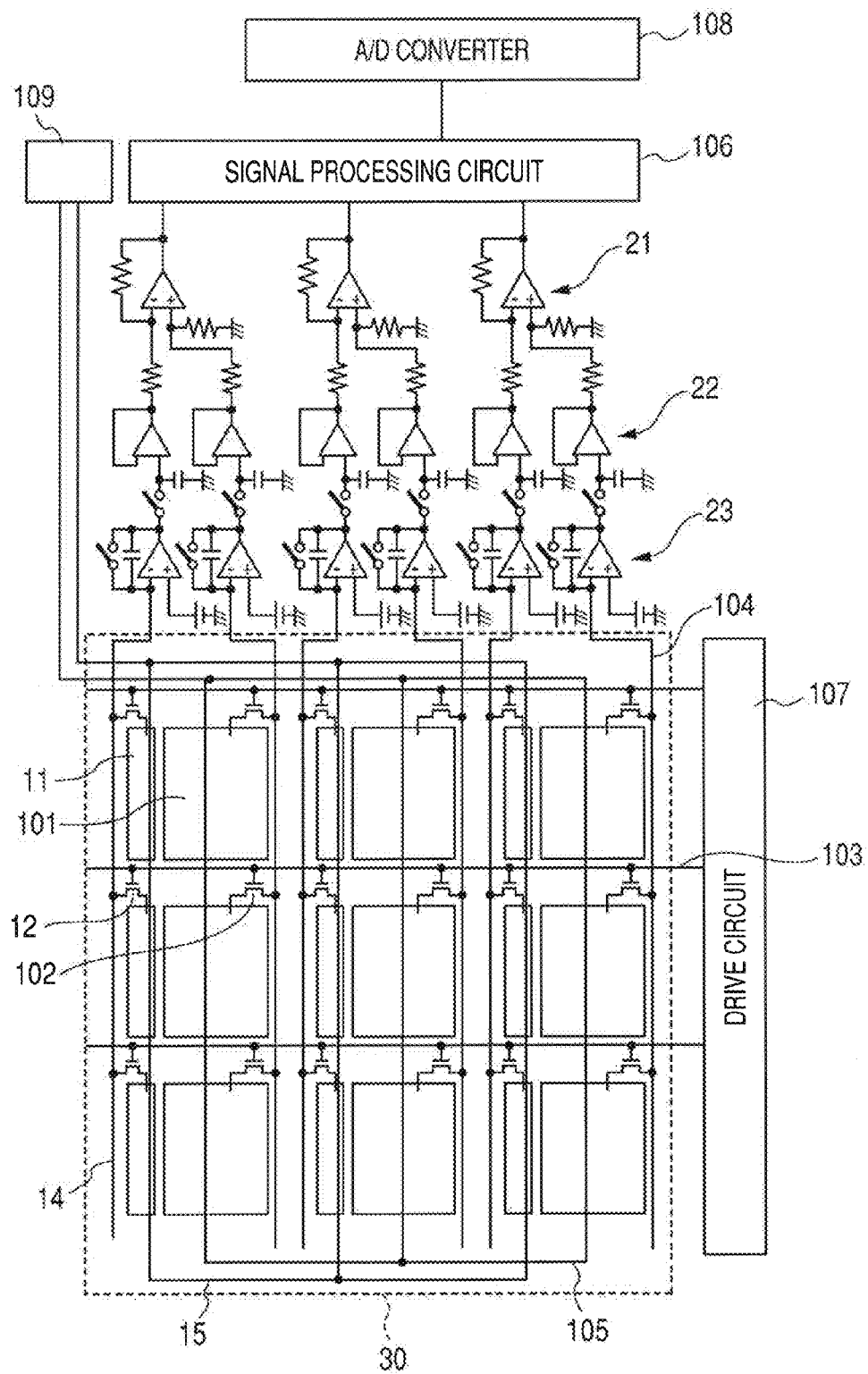
FIG. 16 is a schematic circuit diagram illustrating a case of miniaturizing dummy photoelectric conversion elements in consideration of an aperture ratio in the third embodiment of the present invention.

FIG. 16 is a schematic circuit diagram in the case of miniaturizing the dummy photoelectric conversion elements 11 in consideration of aperture ratio.

Fifth Embodiment

Figure 17:
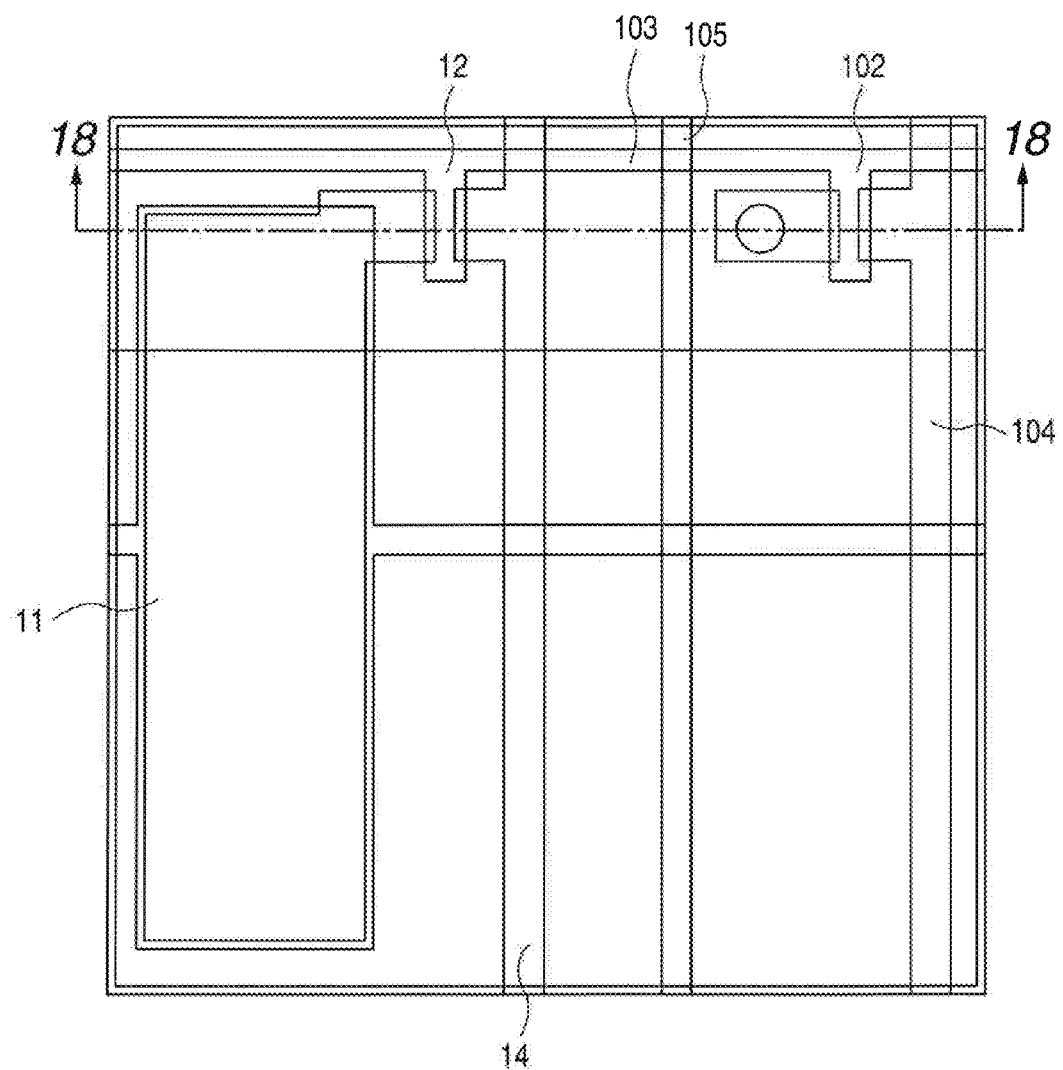
FIG. 17 is a schematic plan view of one pixel of a radiation detecting apparatus as a fourth embodiment of the present invention.

FIG. 17 is a schematic plan view of a pixel of a radiation detecting apparatus as a fifth embodiment of the present invention. The present embodiment is another example of the fourth embodiment. Consequently, the circuit configuration is the same as that of the third embodiment.

Figure 18:
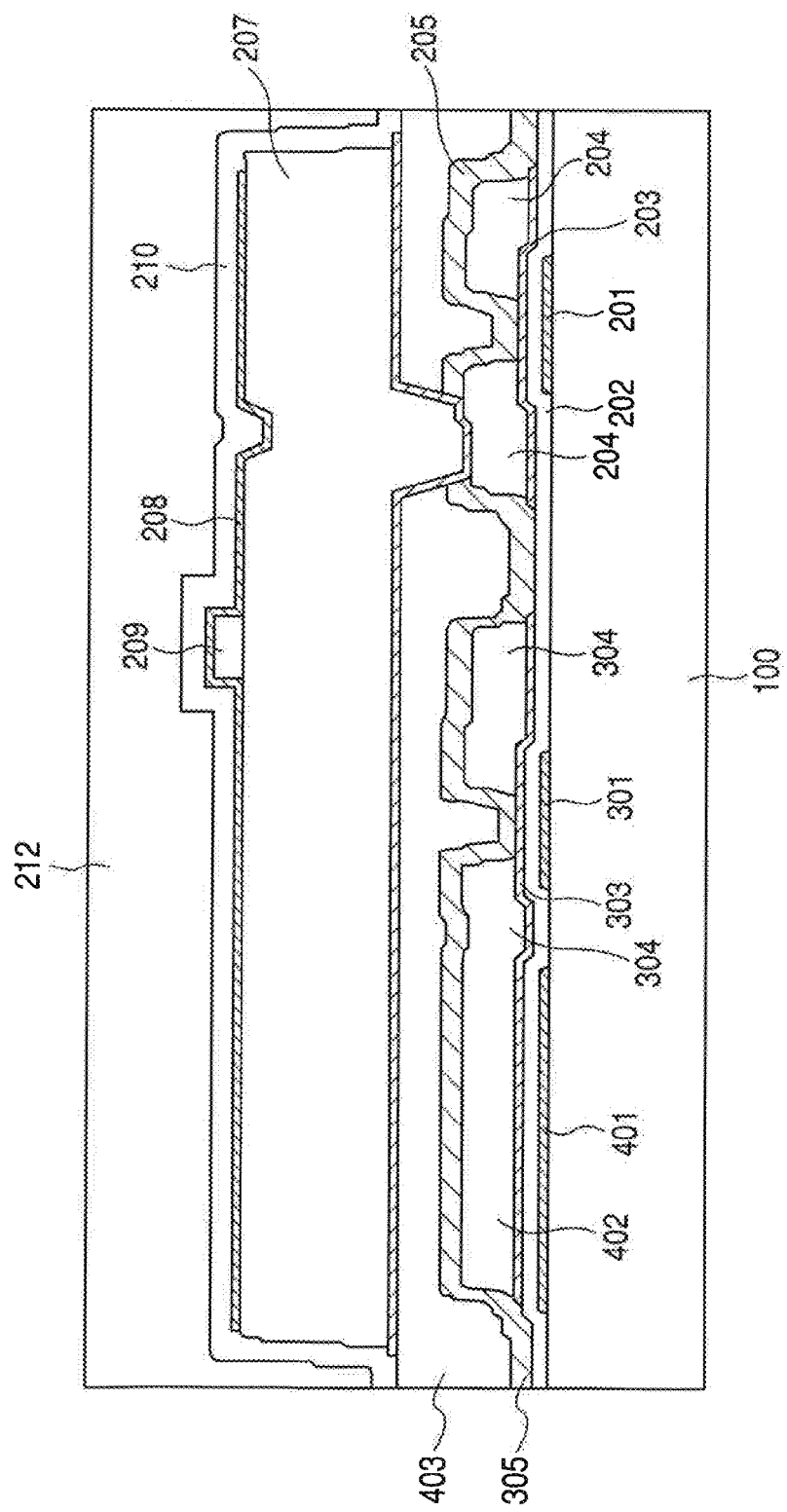
FIG. 18 is a schematic sectional view taken along line 18-18 of FIG. 17.

FIG. 18 is a schematic sectional view taken along line 18-18 in FIG. 17.

As illustrated in FIG. 18, the dummy photoelectric conversion element 11 having a metal-insulator semiconductor (MIS) type structure includes a lower electrode 401 connected to not-illustrated fixed potential. Moreover, the dummy photoelectric conversion element 11 includes an upper electrode 402 connected to the dummy TFT 12 electrically. The photoelectric conversion element 101 is laminated to be arranged over the transfer TFT 102, the dummy TFT 12, and the dummy photoelectric conversion element 11 to cover them with an interlayer insulation layer 403 put between the photoelectric conversion element 101, and the TFTs 102 and 12 and the dummy photoelectric conversion element 11. A scintillator layer (not illustrated), which converts radiation into visible light, is arranged over the photoelectric conversion element 101 as a conversion element. The present configuration has an aperture ratio of a light receiving portion than that of the configuration in which the TFTs 102 and the photoelectric conversion elements 101 are arranged in a plane.

In the present embodiment, the dummy signal lines 14 and the dummy TFTs 12 have the same layer configurations and the same sizes as those of the signal lines 104 and the transfer TFTs 102, respectively, similarly to the third embodiment. Moreover, the dummy photoelectric conversion elements 11 and the photoelectric conversion elements 101 have almost the same capacity. The dummy photoelectric conversion elements 11 are shielded from light lest any light from the scintillator layer should enter the dummy photoelectric conversion elements 11. Accordingly, the dummy photoelectric conversion elements 11 are formed as simple capacitances (capacitor devices).

As a result, dark outputs can be effectively deducted from signal outputs.

Sixth Embodiment

Figure 19:
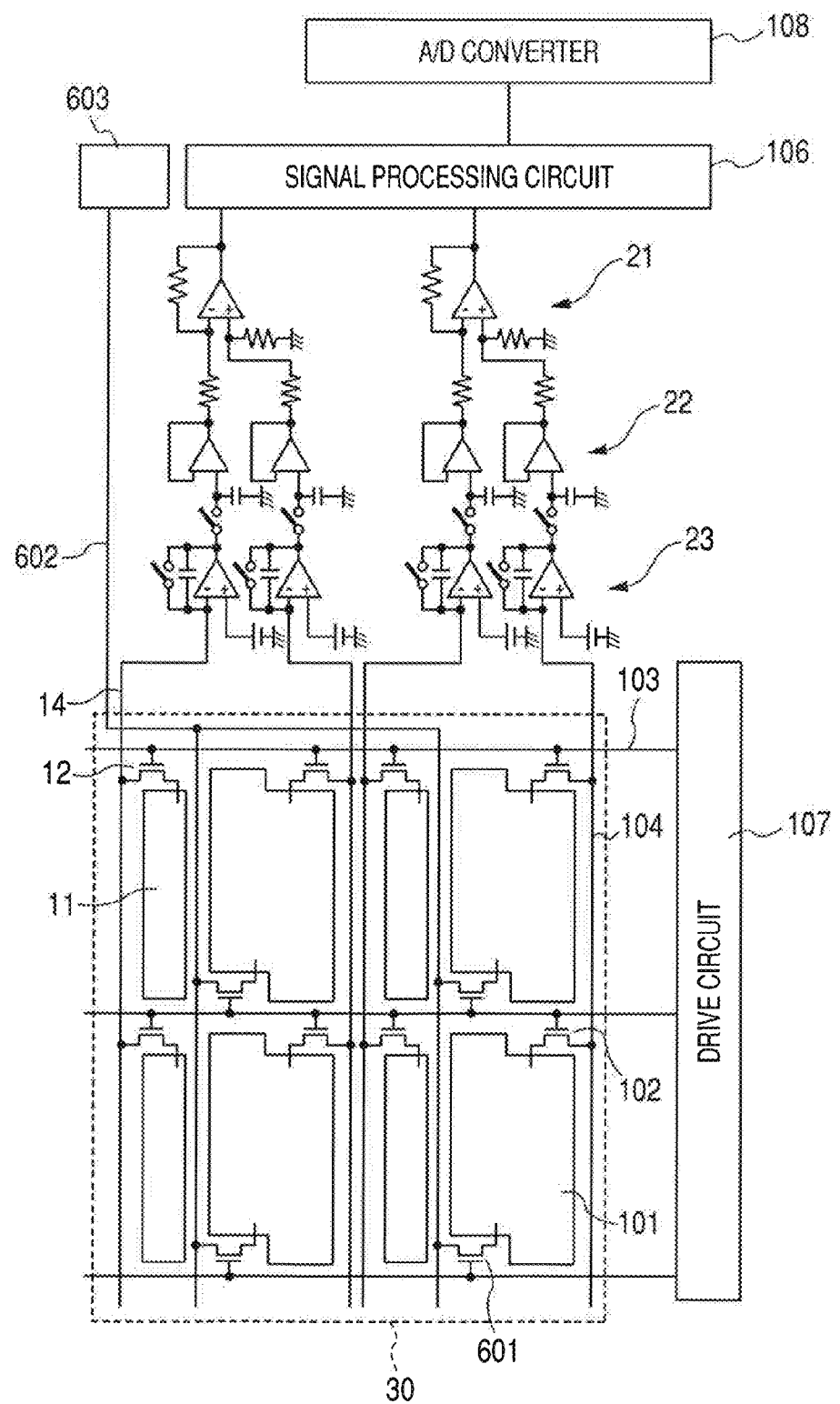
FIG. 19 is a schematic circuit diagram illustrating the configuration of a radiation detecting apparatus as a fifth embodiment of the present invention.

FIG. 19 is a schematic circuit diagram illustrating the configuration of a radiation detecting apparatus as a sixth embodiment of the present invention.

As illustrated in FIG. 19, the radiation detecting apparatus includes reset TFTs 601 as third switch elements for resetting the photoelectric conversion elements 101, a resetting bias line 602, a resetting power source 603, and the other components denoted by the same signs as those of the preceding embodiments. The PIN type photoelectric conversion elements 101, the transfer TFT's 102, a dummy PIN type photoelectric conversion elements 11, the dummy TFT's 12, the first signal lines 104, a second signal lines 14, the drive lines 103 and a reset TFT 601 and a reset bias line 602 are formed on an insulating substrate for forming a radiation detecting substrate 30.

Also in the present embodiment, the dummy signal lines 14 and the dummy TFTs 12 have the same layer configurations and the same sizes as those of the signal lines 104 and the transfer TFTs 101, respectively, similarly in the fifth embodiment. Moreover, the dummy photoelectric conversion elements 11 and the photoelectric conversion elements 101 have almost the same capacity. Moreover, not-illustrated bias lines are connected to the dummy photoelectric conversion elements 11 and the photoelectric conversion elements 101, respectively.

As a result, dark outputs can be effectively deducted from signal outputs.

According to the above described embodiments, each element is arranged so that the numbers of the crossing portions of the signal lines 104 and the dummy signal lines 14 with the gate lines may be the same. By making the numbers of the crossing portions same as described above, pertinent signals can be obtained when the number of the TFTs is large.

Although the indirect FPDs combining scintillators converting X rays and the like into visible lights with the PIN type photoelectric conversion elements 101 have been described in the present specification, indirect PPDs using MIS type photoelectric conversion elements can be also used. Then, direct FPDs using direct conversion elements (such as a-Se) converting X rays and the like directly into charges can be also used. Moreover, the present invention exerts the same effects on a visible light detection apparatus. The TFT configurations using a-Si and poly-Si bring about the same effects by their application to the present invention.

Figure 21:
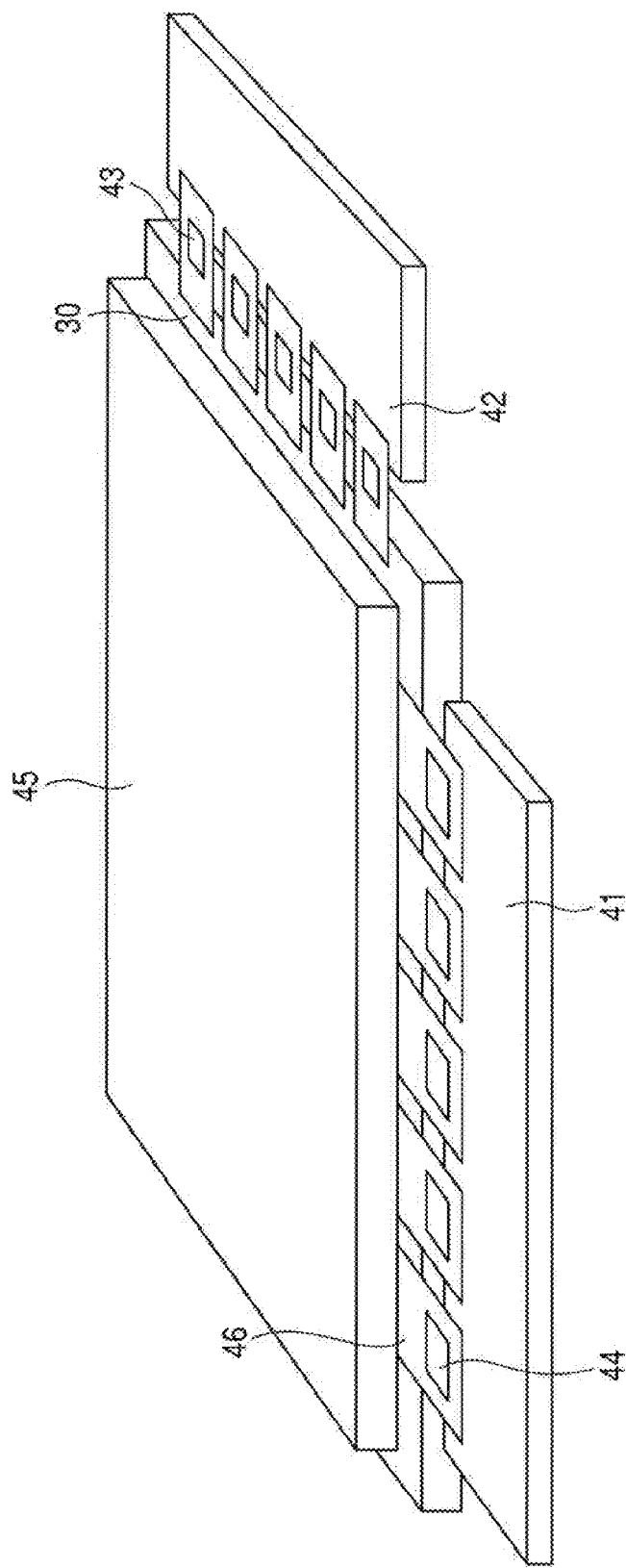
FIG. 21 is a perspective view illustrating a structure of a radiation detecting apparatus according to an embodiment of the present invention.

FIG. 21 is a perspective view illustrating a structure of a radiation detecting apparatus according to an embodiment of the present invention. On a top of a radiation detecting substrate 30, a scintillator 45 is disposed for converting X-ray into a light such as a visible light. At a periphery thereof, a gate driver circuit unit 42 (operating as a driver) and a signal processing circuit 41 are disposed. A common electrode driver circuit unit is not shown in the drawings, but is disposed at a side of the signal processing circuit 41. In case of using, as the conversion element, a direct conversion type element converting the radiation into the light such as the visible light, the scintillator 45 would be unnecessary. 42 denotes an IC as provided being a part of the gate driver circuit. 44 denotes an IC as provided being a part of the signal processing circuit. This IC 44 may include a differential amplifier 21 operating as the differential unit, a buffer amplifier 22, an integrating amplifier 23 and the other peripheral circuit. 46 denotes a flexible substrate.

Figure 22:
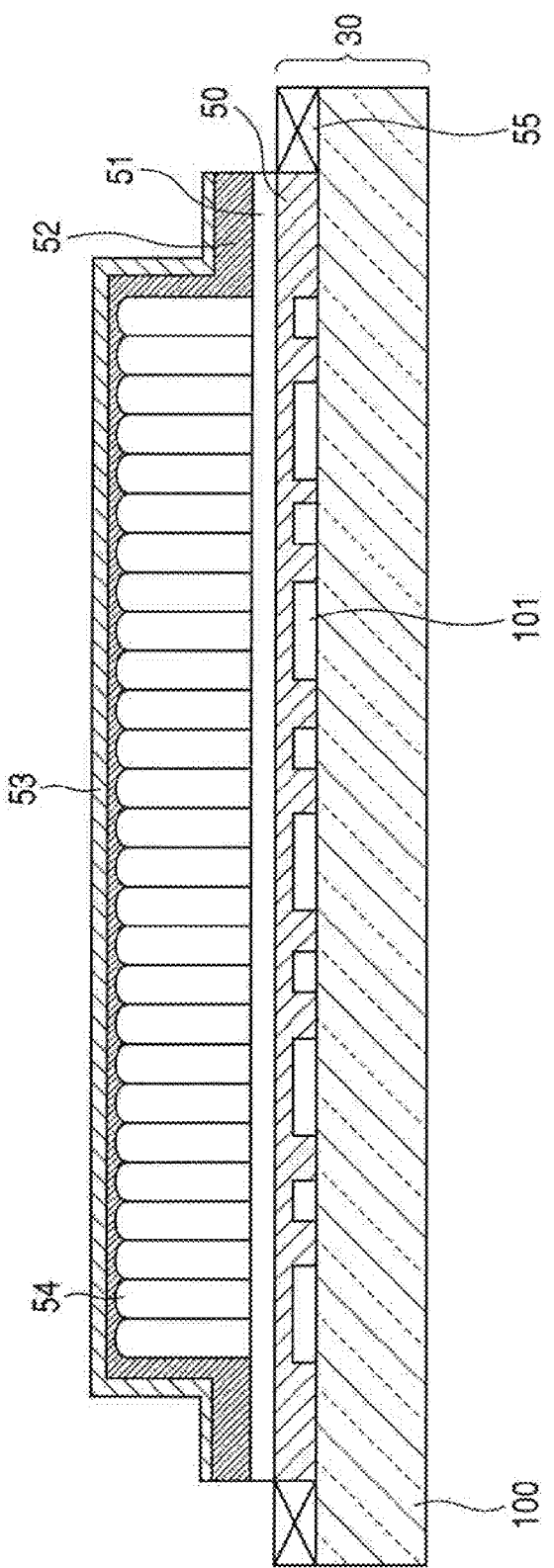
FIG. 22 is a perspective view illustrating a structure wherein, at a top of a substrate for a radiation detecting, a scintillator layer is arranged for converting a radiation such as X-ray into a light such as visible light.

For arranging the scintillator 45 for converting X-rays into light such as visible light on the top of the radiation detecting substrate 30, as shown in FIG. 22, a scintillator layer 54 may be formed directly on the radiation detecting substrate 30 by vapor deposition.

As shown in FIG. 22, on a first protective layer 50 of silicon nitride for protecting the radiation detecting substrate 30, a second protective layer 51 of an organic resin layer may be disposed (second protective layer 51 is not indispensable, and may be omitted). On the first protective layer 50 (or on the second protective layer 51), the scintillator layer 54 is formed. The scintillator layer 54 can be formed directly on the radiation detecting substrate 30 by a vapor deposition process or the like. On the scintillator layer 54, a moisture proof protective layer 52 and a reflective layer 53 are provided. The moisture proof protective layer 52 prevents moisture penetrating into the scintillator layer 54. And, the reflective layer 53 reflects a light from the scintillator layer 54 to a side of the radiation detecting substrate 30.

Figure 23:
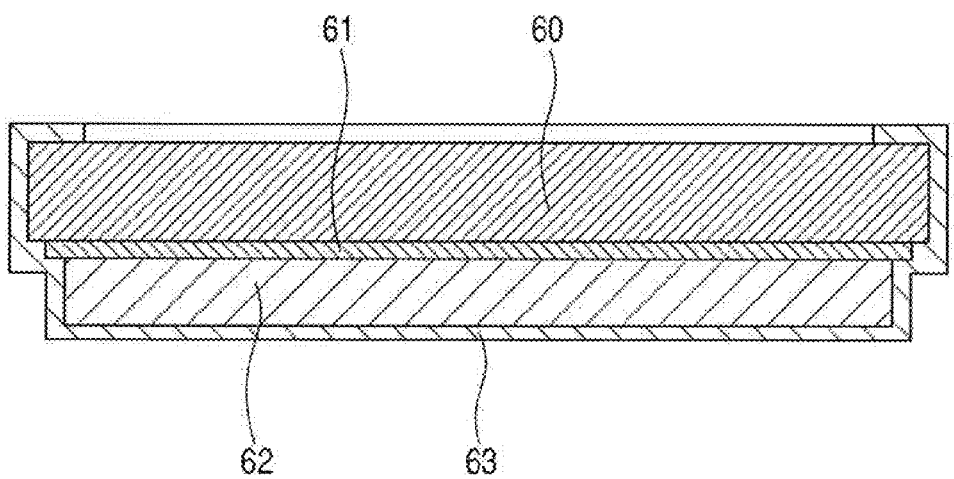
FIG. 23 is a sectional view of a scintillator panel.

As the other arrangement of components, on the radiation detecting substrate 30, the scintillator 45 for converting the X-ray into the light such as the visible light, a structure wherein the radiation detecting substrate 30 and the scintillator panel shown in FIG. 23 are bonded by an adhesive may be used. As shown in FIG. 23, the scintillator panel comprises a base 60 of a material such as amorphous carbon transmitting X-rays, an inorganic film 61 reflecting light, a scintillator layer 62 and a moisture proof protective film 63 of organic film.

Seventh Embodiment

Figure 20:
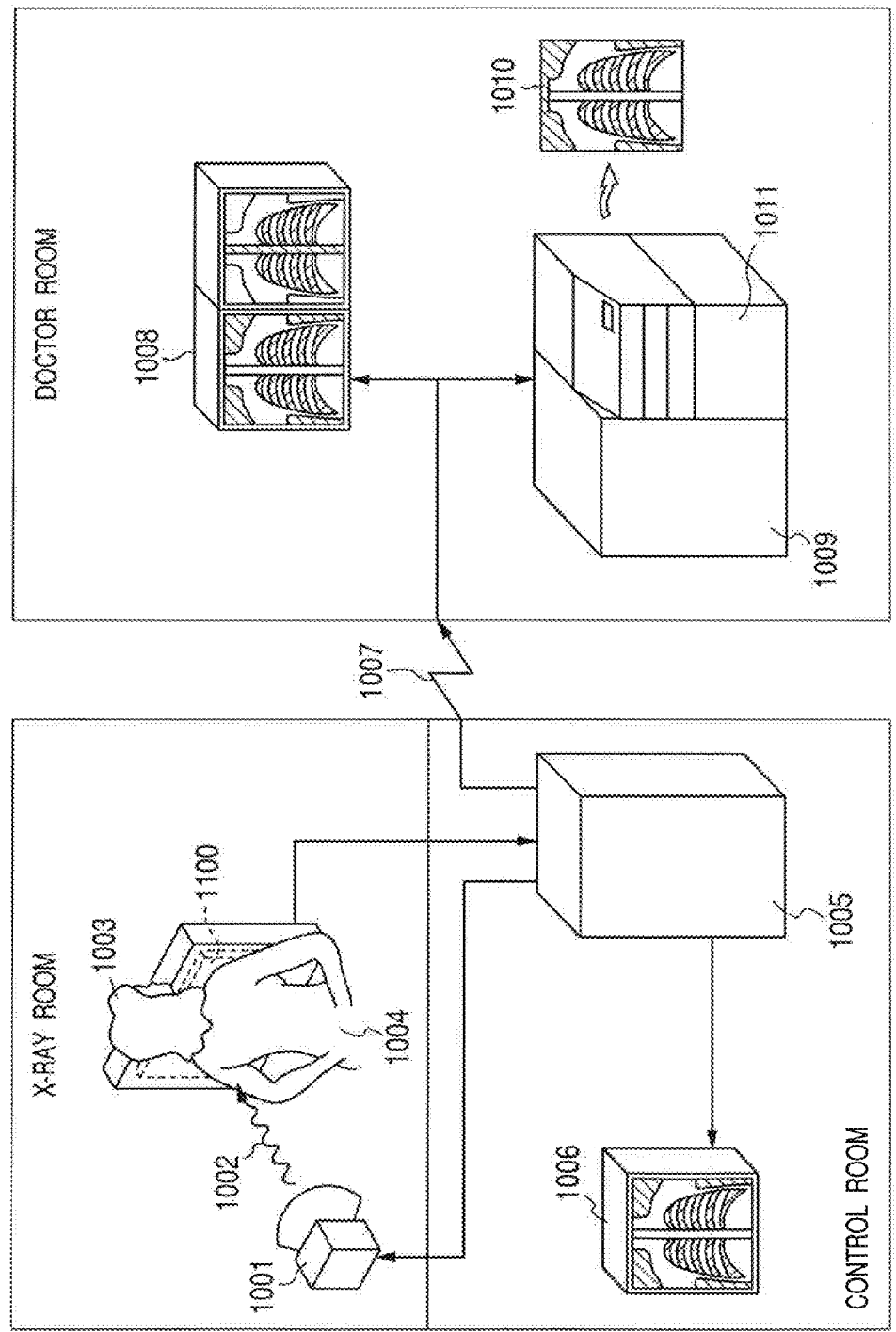
FIG. 20 is a view illustrating an application example of the case where a radiation detecting apparatus according to a suitable embodiment of the present invention is applied to a radiation imaging system that is a radiological diagnostic system.

FIG. 20 is a view illustrating an application example of the case where a radiation detecting apparatus according to a suitable embodiment of the present invention is applied to a radiation imaging system, which is a radiological diagnostic system. According to the present embodiment, the radiation may encompass X-rays, γ-rays, or corpuscular beams such as α beams, β beams or the like.

Radiation 1002 generated by a radiation tube 1001 as a radiation source transmits a portion 1004, such as a chest, of a body of a subject (patient or the like) 1003, and enters a radiation detecting apparatus 1100 mounted with scintillators at the upper part thereof. As the radiation detecting apparatus 1100, the radiation detecting apparatus described in the above embodiments can be used.

The incident radiation 1002 includes the information of the internal portion of the subject 1003. In the radiation detecting apparatus 1100, the scintillators emit lights correspondingly to the incidence of the radiation 1002, and electric information is obtained by photoelectrically converting the emitted lights.

Moreover, in the radiation detecting apparatus 1100, the radiation 1002 may be directly converted into charges to obtain the electric information. The information is converted into digital information, and is subjected to image processing by an image processor 1005 as a signal processing unit to be displayed on a display 1006 as a display unit in a control room.

Moreover, the information can be transferred to a remote place by a transmission unit 1007, such as a wireless circuit or a wired circuit, such as telephone lines.

Thereby, the information can be displayed on a display 1008 as a display unit or can be saved in a recording medium, such as an optical disk, by a film processor 1009 as a storage unit, which units are installed in a doctor room or the like at another place.

Herewith, a doctor can also perform a diagnosis at a remote place.

Moreover, the film processor 1009 can be connected to a laser printer as a printing unit, and the information transferred by the transmission unit 1007 can be recorded on a recording medium, such as a film.

As many apparently widely different embodiments of the present invention can be made without departing from the spirit and scope thereof, it is to be understood that the invention is not limited to the specific embodiments thereof except as defined in the claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

INDUSTRIAL APPLICABILITY

The present invention can be used in a medical diagnostic imaging apparatus, a non-destructive inspection system, and an analyzer using radiations.

This application claims the benefit of Japanese Patent Application No. 2007-188206, filed Jul. 19, 2007, and Japanese Patent Application No. 2008-172621, filed Jul. 1, 2008 which are hereby incorporated by reference herein in their entirety.

The invention claimed is:

1. A radiation detecting apparatus comprising:
a plurality of pixels arranged in a matrix, each pixel having a conversion element for converting incident radiation into an electric signal, a first switch element having a gate electrode, a first main electrode, and a second main electrode connected to said conversion element, and a second switch element having a gate electrode, and a semiconductor layer having a channel portion arranged between a first region and a second region, wherein said conversion element is arranged to cover said first and second switch elements;
a first signal line electrically connected to said first main electrode of said first switch element of each pixel in a pixel column;
a second signal line electrically connected to said first region of said second switch element of each pixel in said pixel column;
a drive wiring electrically connected to said gate electrode of said first switch element and said gate electrode of said second switch element of each pixel in a pixel row; and
a differential means electrically connected to said first signal line and said second signal line for outputting a signal corresponding to a difference between outputs from said first and second switch elements,
wherein said second region of said second switch element of each pixel is left floating by omission of electrical connection to said second region or electrically connected to a wiring to which a fixed potential is supplied.

2. The radiation detecting apparatus according to claim 1, wherein the radiation is light, said conversion element is a photoelectric conversion element converting incident light into an electric signal, and
further comprising a scintillator disposed on said photoelectric conversion element of each pixel.

3. A radiation imaging system comprising:
a radiation detecting apparatus according to claim 1; and
a signal processing unit for processing a signal from the radiation detecting apparatus.

4. A radiation detecting apparatus comprising:
a plurality of pixels arranged in a matrix, each pixel having a conversion element for converting incident radiation into an electric signal, a first switch element having a gate electrode, a first main electrode, and a second main electrode connected to said conversion element, and a second switch element having a gate electrode, and a semiconductor layer having a channel portion arranged between a first region and a second region;
a first signal line electrically connected to said first main electrode of said first switch element of each pixel in a pixel column;
a second signal line electrically connected to said first region of said second switch element of each pixel in said pixel column;
a drive wiring electrically connected to said gate electrode of said first switch element and said gate electrode of said second switch element of each pixel in a pixel row; and
a differential means electrically connected to said first signal line and said second signal line for outputting a signal corresponding to a difference between outputs from said first and second switch elements,
wherein said second region of said second switch element of each pixel is electrically connected to a wiring to which a fixed potential is supplied.

5. The radiation detecting apparatus according to claim 4, wherein the radiation is light, said conversion element is a photoelectric conversion element converting incident light into an electric signal, and
further comprising a scintillator disposed on said photoelectric conversion element of each pixel.

6. A radiation imaging system comprising:
a radiation detecting apparatus according to claim 4; and
a signal processing unit for processing a signal from said radiation detecting apparatus.

\* \* \* \* \*